US012812857B2

(12) United States Patent
Lee et al.

(10) Patent No.: US 12,812,857 B2
(45) Date of Patent: Nov. 24, 2026

(54) THREE-DIMENSIONAL SEMICONDUCTOR MEMORY DEVICE WITH DUMMY PAD AND ELECTRONIC SYSTEM INCLUDING THE SAME

(71) Applicant: SAMSUNG ELECTRONICS CO., LTD., Suwon-si (KR)

(72) Inventors: Seungmin Lee, Suwon-si (KR); Daeyeong Lee, Suwon-si (KR); Sunyi Lee, Suwon-si (KR); Jaeho Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 683 days.

(21) Appl. No.: 18/206,785

(22) Filed: Jun. 7, 2023

(65) Prior Publication Data

US 2024/0130122 A1 Apr. 18, 2024

(30) Foreign Application Priority Data

Oct. 13, 2022 (KR) ........................ 10-2022-0131428

(51) Int. Cl.
*H10B 43/27* (2023.01)
*H10B 43/10* (2023.01)
(Continued)

(52) U.S. Cl.
CPC ............. *H10B 43/27* (2023.02); *H10B 43/10* (2023.02); *H10B 43/35* (2023.02); *H10B 43/40* (2023.02);
(Continued)

(58) Field of Classification Search
CPC ........ H10B 53/00; H10B 53/10; H10B 53/20; H10B 53/30; H10B 53/40; H10B 53/50;
(Continued)

(56) References Cited

U.S. PATENT DOCUMENTS 9,331,082 B2 5/2016 Lee et al.
9,343,452 B2 * 5/2016 Yun ........................ H10B 43/35
(Continued)

FOREIGN PATENT DOCUMENTS

KR 10-1997-0077185 A 12/1997
KR 10-1999-0059192 A 7/1999
(Continued)

*Primary Examiner* — William B Partridge
*Assistant Examiner* — Gustavo G Ramallo
(74) *Attorney, Agent, or Firm* — Muir Patent Law, PLLC

(57) ABSTRACT

A three-dimensional semiconductor memory device may include a substrate, a stack including interlayer insulating layers and gate electrodes alternatingly stacked on the substrate, a dummy pad on a pad portion of each gate electrode, a source structure between the substrate and the stack, and first vertical channel structures that penetrate the stack and the source structure. The pad portions may include a first pad portion vertically overlapped with the dummy pad and a second pad portion horizontally overlapped with the dummy pad. The first and second pad portions may be spaced apart from the dummy pad, and one of the interlayer insulating layers may be interposed between the first pad portion and the dummy pad. The one of the interlayer insulating layers may extend continuously from a first portion to a second portion via a connection portion.

14 Claims, 27 Drawing Sheets

(51) Int. Cl.

| | |
|---|---|
| ***H10B 43/35*** | (2023.01) |
| ***H10B 43/40*** | (2023.01) |
| ***H10B 80/00*** | (2023.01) |
| ***H10W 20/41*** | (2026.01) |
| ***H10W 20/42*** | (2026.01) |
| ***H10W 90/00*** | (2026.01) |
| *H10W 90/20* | (2026.01) |

(52) U.S. Cl.
CPC ............ *H10B 80/00* (2023.02); *H10W 20/42* (2026.01); *H10W 20/435* (2026.01); *H10W 90/00* (2026.01); *H10W 90/297* (2026.01)

(58) Field of Classification Search
CPC ........ H10B 41/00; H10B 41/10; H10B 41/20; H10B 41/23; H10B 41/27; H10B 41/30; H10B 41/35; H10B 41/40–44; H10B 41/465; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 9,373,540 | B2 | 6/2016 | Hyun | |
| 10,134,672 | B2 | 11/2018 | Inatsuka | |
| 10,438,801 | B2 | 10/2019 | Sakuma et al. | |
| 10,804,286 | B2 | 10/2020 | Takamura et al. | |
| 10,998,333 | B2 | 5/2021 | Oh | |
| 2017/0358590 | A1 * | 12/2017 | Kang .................... | H10B 41/27 |
| 2022/0093633 | A1 | 3/2022 | Ishiduki | |
| 2022/0278051 | A1 | 9/2022 | Scarbrough et al. | |

FOREIGN PATENT DOCUMENTS

| | | | |
|---|---|---|---|
| KR | 10-1999-0062227 | A | 7/1999 |
| KR | 2022-0047934 | A | 4/2022 |

* cited by examiner

THREE-DIMENSIONAL SEMICONDUCTOR MEMORY DEVICE WITH DUMMY PAD AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2022-0131428, filed on Oct. 13, 2022, in the Korean Intellectual Property Office, the entire contents of which are hereby incorporated by reference.

BACKGROUND

1. Field

Embodiments relate to a three-dimensional semiconductor memory device and an electronic system including the same. In particular, embodiments may relate to a nonvolatile three-dimensional semiconductor memory device including a vertical channel structure, a method of fabricating the same, and an electronic system including the same.

2. Description of the Related Art

A semiconductor device capable of storing a large amount of data is desired as a part of an electronic system. Higher integration of semiconductor devices is desirable to satisfy consumer demands for large data storing capacity, superior performance, and inexpensive prices. In the case of two-dimensional or planar semiconductor devices, their integration is mainly determined by the area occupied by a unit memory cell. Accordingly, integration is greatly influenced by the degree of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

An embodiment provides a three-dimensional semiconductor memory device with improved electrical and reliability characteristics and a method of reducing process difficulty and cost in a process of fabricating a three-dimensional semiconductor memory device.

According to an embodiment an electronic system may be provided that includes the three-dimensional semiconductor memory device.

According to an embodiment, a three-dimensional semiconductor memory device may include a first substrate including a cell array region and a contact region extended from the cell array region, a stack including interlayer insulating layers and gate electrodes, which are alternatingly stacked on the first substrate, each of the gate electrodes having a pad portion on the contact region, an insulating layer provided to enclose the stack, a dummy pad provided on the pad portion, a source structure provided between the cell array region of the first substrate and the stack, and first vertical channel structures provided on the cell array region to fill vertical channel holes penetrating the stack and the source structure. The pad portions may include a first pad portion, which is vertically overlapped with the dummy pad, and a second pad portion, which is overlapped with the dummy pad in a first direction parallel to a top surface of the first substrate. The first pad portion and the second pad portion may be spaced apart from the dummy pad, and one of the interlayer insulating layers may be interposed between the first pad portion and the dummy pad. The one of the interlayer insulating layers may include a connection portion, which is vertically overlapped with a space between the dummy pad and the second pad portion, a first portion, which is vertically overlapped with the second pad portion, and a second portion, which is vertically overlapped with the dummy pad. The connection portion may be interposed between the first portion and the second portion, and the one of the interlayer insulating layers may be continuously extended from the first portion to the second portion via the connection portion.

According to an embodiment, a three-dimensional semiconductor memory device may include a first substrate including a cell array region and a contact region extended from the cell array region, a peripheral circuit structure on the first substrate, the peripheral circuit structure including peripheral circuit transistors formed on the first substrate and first bonding pads connected to the peripheral circuit transistors, a stack including interlayer insulating layers and gate electrodes, which are alternatingly stacked on the peripheral circuit structure, each of the gate electrodes having a pad portion on the contact region, vertical channel structures provided on the cell array region to fill vertical channel holes penetrating the stack, an insulating layer enclosing the stack, a dummy pad provided below the pad portion, a second substrate on the stack, cell contact plugs penetrating the insulating layer and the dummy pad, conductive lines connected to the cell contact plugs, bit lines connected to the vertical channel structures, and second bonding pads connected to the conductive lines and the bit lines and bonded to the first bonding pads to form a single object. The gate electrodes may include a first gate electrode, which is vertically spaced apart from the dummy pad, and a second gate electrode, which is spaced apart from the dummy pad in a first direction parallel to a top surface of the first substrate. One of the interlayer insulating layers may be interposed between the first gate electrode and the dummy pad, and the cell contact plugs may be in contact with the gate electrodes. The dummy pad may be electrically connected to the peripheral circuit structure through one of the cell contact plugs.

According to an embodiment, an electronic system may include a three-dimensional semiconductor memory device including a first substrate including a cell array region and a contact region extended from the cell array region, a peripheral circuit structure on the first substrate, a cell array structure on the peripheral circuit structure, an insulating layer covering the cell array structure, and an input/output pad provided on the insulating layer and electrically connected to the peripheral circuit structure, and a controller, which is electrically connected to the three-dimensional semiconductor memory device through the input/output pad and is configured to control the three-dimensional semiconductor memory device. The cell array structure may include a second substrate on the peripheral circuit structure, a stack including interlayer insulating layers and gate electrodes, which are alternatingly stacked on the second substrate, each of the gate electrodes including a pad portion on the contact region, a dummy pad provided on the pad portion, and vertical channel structures provided on the cell array region to fill vertical channel holes penetrating the stack, and cell contact plugs penetrating the insulating layer and the dummy pad. The gate electrodes may include a first gate electrode, which is vertically spaced apart from the dummy pad, and a second gate electrode, which is spaced apart from the dummy pad in a first direction parallel to a top surface of the first substrate. One of the interlayer insulating layers may be interposed between the dummy pad and the first gate electrode. A bottom surface of the dummy pad may be in contact with the one of the interlayer insulating layers, and the dummy pad may be electrically connected to the controller through the cell contact plug.

BRIEF DESCRIPTION OF THE DRAWINGS

Features will become apparent to those of skill in the art by describing in detail exemplary embodiments with reference to the attached drawings in which:

FIGS. 9A to 14A are sectional views, each of which is taken along the line I-I' of FIG. 5 to illustrate a method of fabricating a three-dimensional semiconductor memory device, according to an embodiment.

FIGS. 9B to 14B are sectional views, each of which is taken along the line II-II' of FIG. 5 to illustrate a method of fabricating a three-dimensional semiconductor memory device, according to an embodiment.

DETAILED DESCRIPTION

Example embodiments will now be described more fully with reference to the accompanying drawings, in which example embodiments are shown.

Figure 1:
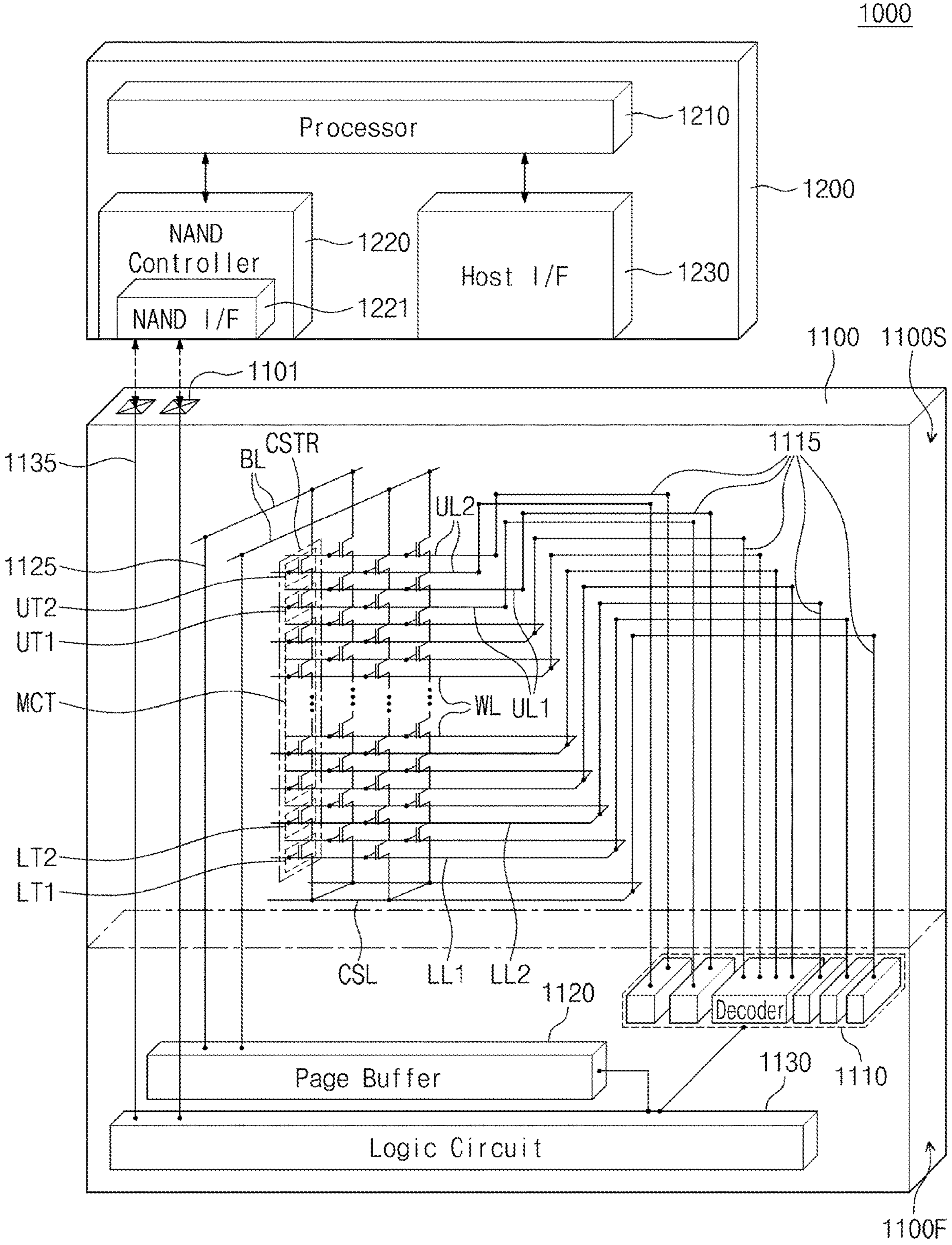
FIG. 1 is a diagram schematically illustrating an electronic system including a three-dimensional semiconductor memory device, according to an embodiment.

FIG. 1 is a diagram schematically illustrating an electronic system including a three-dimensional semiconductor memory device, according to an embodiment.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 or an electronic device including the storage device. For example, the electronic system 1000 may be a solid state drive (SSD) device, a universal serial bus (USB), a computing system, a medical system, or a communication system, in which at least one of three-dimensional semiconductor memory devices 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. For example, the first region 1100F may be disposed near the second region 1100S. The first region 1100F may be a peripheral circuit region that includes a decoder circuit 1110, a page buffer 1120, and a logic circuit 1130. The second region 1100S may be a memory cell region that includes a bit line BL, a common source line CSL, word lines WL, first lines LL1 and LL2, second lines UL1 and UL2, and memory cell strings CSTR between the bit line BL and the common source line CSL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed, according to embodiments.

In an embodiment, the first transistors LT1 and LT2 may include a ground selection transistor. The second transistors UT1 and UT2 may include a string selection transistor. The first lines LL1 and LL2 may serve as gate electrodes of the first transistors LT1 and LT2, respectively. The word lines WL may serve as gate electrodes of the memory cell transistors MCT. The second lines UL1 and UL2 may serve as gate electrodes of the second transistors UT1 and UT2, respectively.

In an embodiment, the first transistors LT1 and LT2 may include a first erase control transistor LT1 and a ground selection transistor LT2, which are connected in series. The second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which extend from the first region 1100F to the second region 1100S. The bit line BL may be electrically connected to the page buffer 1120 through second interconnection lines 1125, which are extended from the first region 1100F to the second region 1100S.

In the first region 1100F, the decoder circuit 1110 and the page buffer 1120 may be configured to perform a control operation, which may be performed on at least one selected one of the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which extends from the first region 1100F to the second region 1100S.

The controller 1200 may include a processor 1210, a NAND controller 1220, and a host interface 1230. For example, the electronic system 1000 may include a plurality of three-dimensional semiconductor memory devices 1100, and the controller 1200 may control the three-dimensional semiconductor memory devices 1100.

The processor 1210 may control the overall operations of the electronic system 1000 including the controller 1200. Based on a specific firmware, the processor 1210 may execute operations of controlling the NAND controller 1220 and accessing the three-dimensional semiconductor memory device 1100. The NAND controller 1220 may include a NAND interface 1221, which can be used for communication with the three-dimensional semiconductor memory device 1100. The NAND interface 1221 may be used to transmit and receive control commands, which are used to control the three-dimensional semiconductor memory device 1100, data, which can be written in or read from the memory cell transistors MCT of the three-dimensional semiconductor memory device 1100, and so forth. The host interface 1230 may be configured to allow for communication between the electronic system 1000 and an external host. When a control command is received from an external host through the host interface 1230, the processor 1210 may control the three-dimensional semiconductor memory device 1100 in response to the control command.

Figure 2:
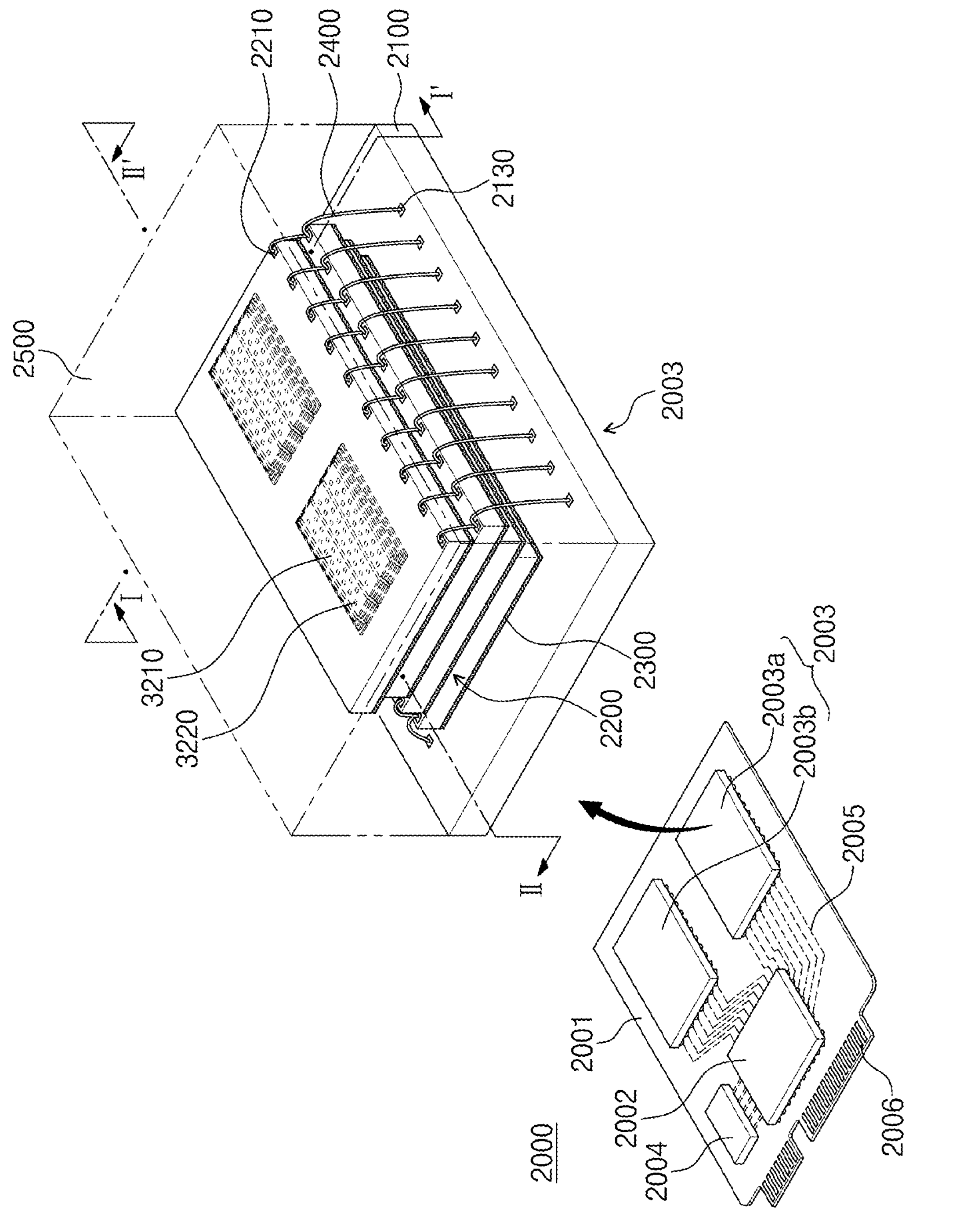
FIG. 2 is a perspective view schematically illustrating an electronic system including a three-dimensional semiconductor memory device, according to an embodiment.

FIG. 2 is a perspective view schematically illustrating an electronic system including a three-dimensional semiconductor memory device, according to an embodiment.

Referring to FIG. 2, an electronic system 2000 may include a main substrate 2001, a controller 2002, at least one semiconductor package 2003, and a DRAM 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an embodiment, the electronic system 2000 may communicate with the external host, in accordance with interfaces, such as a universal serial bus (USB), a peripheral component interconnect express (PCI-Express), a serial advanced technology attachment (SATA), a universal flash storage (UFS) M-PHY, or the like. In an embodiment, the electronic system 2000 may be driven by electric power, which may be supplied from the external host through the connector 2006. The electronic system 2000 may further include a power management integrated circuit (PMIC), which may be used to distribute power supplied from the external host to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory. The buffer memory may relieve technical difficulties that could be caused by a difference in speed between the semiconductor package 2003, which serves as a data storage device, and an external host. In an embodiment, the DRAM 2004 in the electronic system 2000 may serve as a cache memory and may provide a storage space in which data may be temporarily stored during various control operations performed on the semiconductor package 2003. When the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages **2003*a* and 2003*b*, which are spaced apart from each other. Each of the first and second semiconductor packages 2003*a* and 2003*b* may be a semiconductor package includes a plurality of semiconductor chips 2200. Each of the first and second semiconductor packages 2003*a* and 2003*b* may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400**.

The package substrate 2100 may be a printed circuit board that includes package upper pads 2130. Each of the semiconductor chips 2200 may include input/output pads 2210. Each of the input/output pads 2210 may correspond to the input/output pad 1101 shown in FIG. 1. Each of the semiconductor chips 2200 may include gate stacks 3210 and vertical channel structures 3220. Each of the semiconductor chips 2200 may include a three-dimensional semiconductor memory device, which will be described below.

In an embodiment, the connection structure 2400 may be a bonding wire electrically connecting the input/output pads 2210 to the package upper pads 2130. In each of the first and second semiconductor packages **2003*a* and 2003*b*, the semiconductor chips 2200 may be electrically connected to each other in a bonding wire manner and may be electrically connected to the package upper pads 2130 of the package substrate 2100. In an embodiment, the semiconductor chips 2200 in each of the first and second semiconductor packages 2003*a* and 2003*b* may be electrically connected to each other by through silicon vias (TSVs), not by the connection structure 2400** provided in the form of bonding wires.

In an embodiment, the controller 2002 and the semiconductor chips 2200 may be included in a single package. For example, the controller 2002 and the semiconductor chips 2200 may be mounted on an interposer substrate, which is prepared independent of the main substrate 2001, and may be connected to each other through interconnection lines, which are provided in the interposer substrate.

Figure 3:
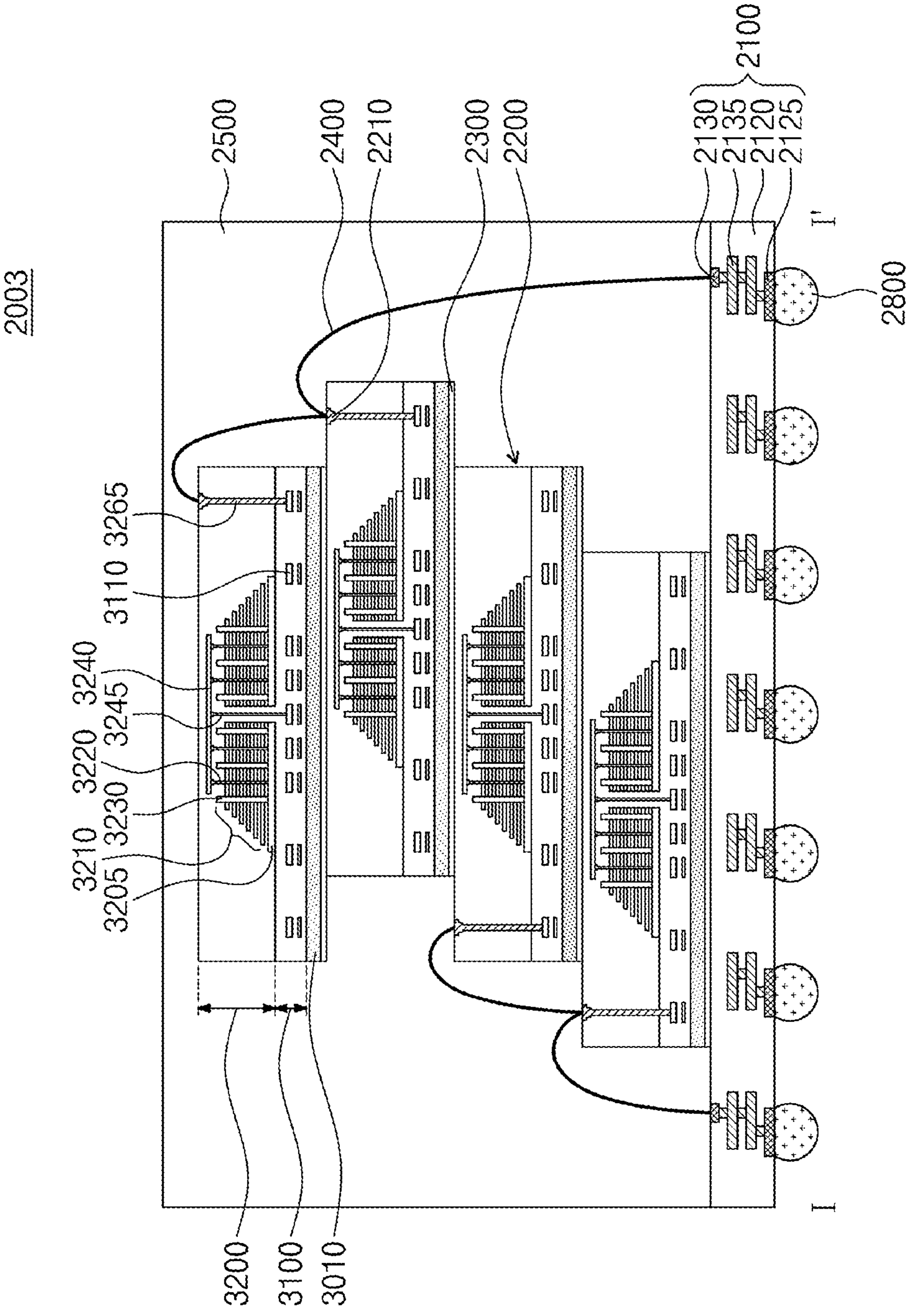
FIGS. 3 and 4 are sectional views, which are respectively taken along lines I-I' and II-II' of FIG. 2 to illustrate a semiconductor package including a three-dimensional semiconductor memory device, according to an embodiment.
Figure 4:
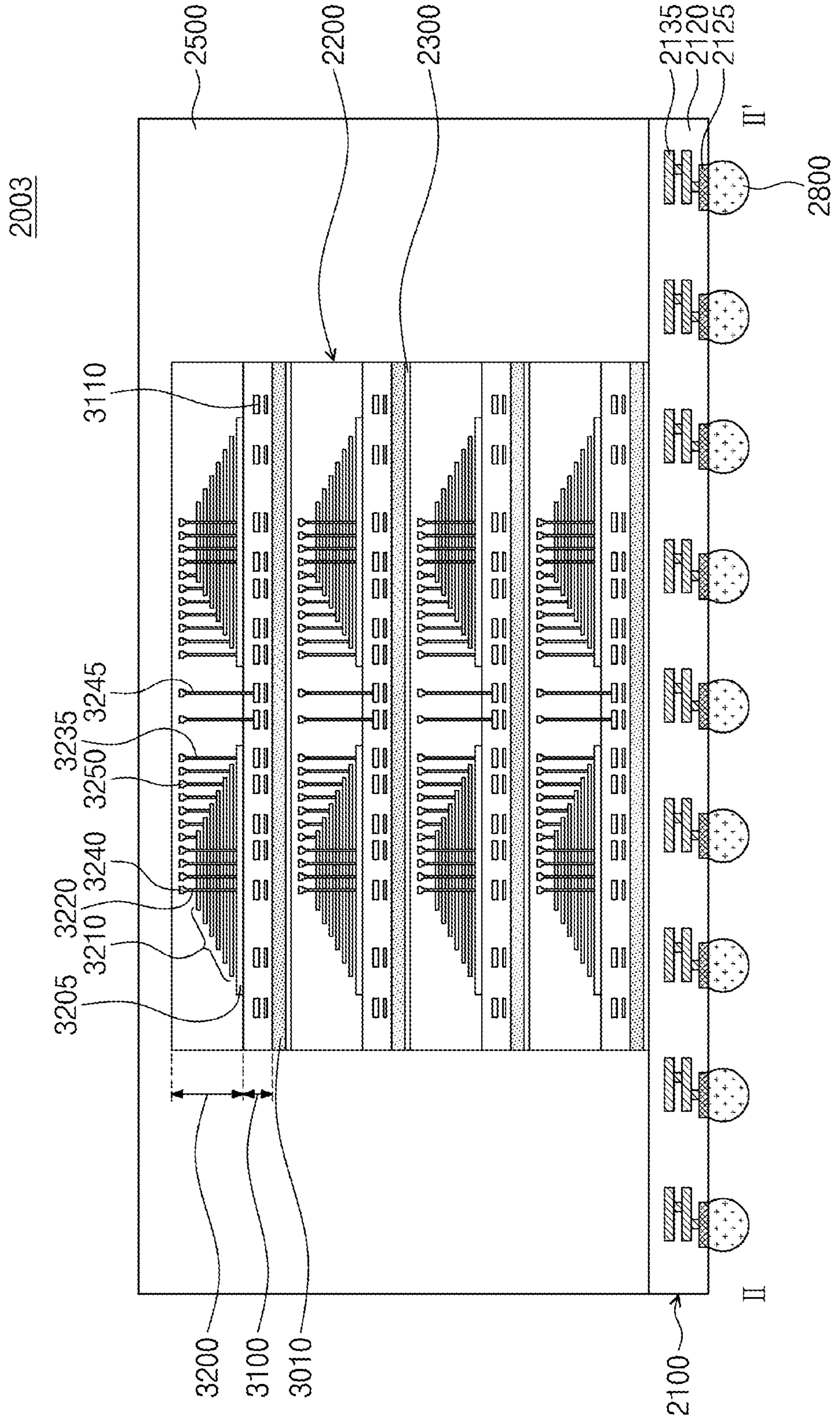

FIGS. 3 and 4 are sectional views, which are respectively taken along lines I-I' and II-II' of FIG. 2 to illustrate a semiconductor package including a three-dimensional semiconductor memory device, according to an embodiment.

Referring to FIGS. 3 and 4, the semiconductor package 2003 may include the package substrate 2100, a plurality of semiconductor chips on the package substrate 2100, and the molding layer 2500 covering the package substrate 2100 and the semiconductor chips.

The package substrate 2100 may include a package substrate body portion 2120, the package upper pads 2130 may be disposed on a top surface of the package substrate body portion 2120, lower pads 2125 may be disposed on or exposed through a bottom surface of the package substrate body portion 2120, and internal lines 2135 may be provided in the package substrate body portion 2120 to electrically connect the upper pads 2130 to the lower pads 2125. The package upper pads 2130 may be electrically connected to the connection structures 2400. The lower pads 2125 may be connected to the interconnection patterns 2005 of the main substrate 2001 of the electronic system 2000, as shown in FIG. 2, through conductive connecting portions 2800.

Each of the semiconductor chips 2200 may include a semiconductor substrate 3010, a first structure 3100, and a second structure 3200, which are sequentially stacked on the semiconductor substrate 3010. The first structure 3100 may include a peripheral circuit region, in which peripheral lines 3110 are provided. The second structure 3200 may include a common source line 3205, the gate stack 3210 on the common source line 3205, the vertical channel structures 3220, separation structures 3230 penetrating the gate stack 3210, bit lines 3240 electrically connected to the vertical channel structures 3220, gate connection lines 3235 electrically connected to the word lines WL (e.g., see FIG. 1) of the gate stack 3210, and conductive lines 3250.

Each of the semiconductor chips 2200 may be electrically connected to the peripheral lines 3110 of the first structure 3100 and may include a penetration line 3245 that extends into the second structure 3200. The penetration line 3245 may be provided to penetrate the gate stack 3210 and may be disposed outside the gate stack 3210. Each of the semiconductor chips 2200 may be electrically connected to the peripheral lines 3110 of the first structure 3100 and may further include an input/output connection line 3265 that extends into the second structure 3200, and into the input/output pad 2210, which is electrically connected to the input/output connection line 3265.

Figure 5:
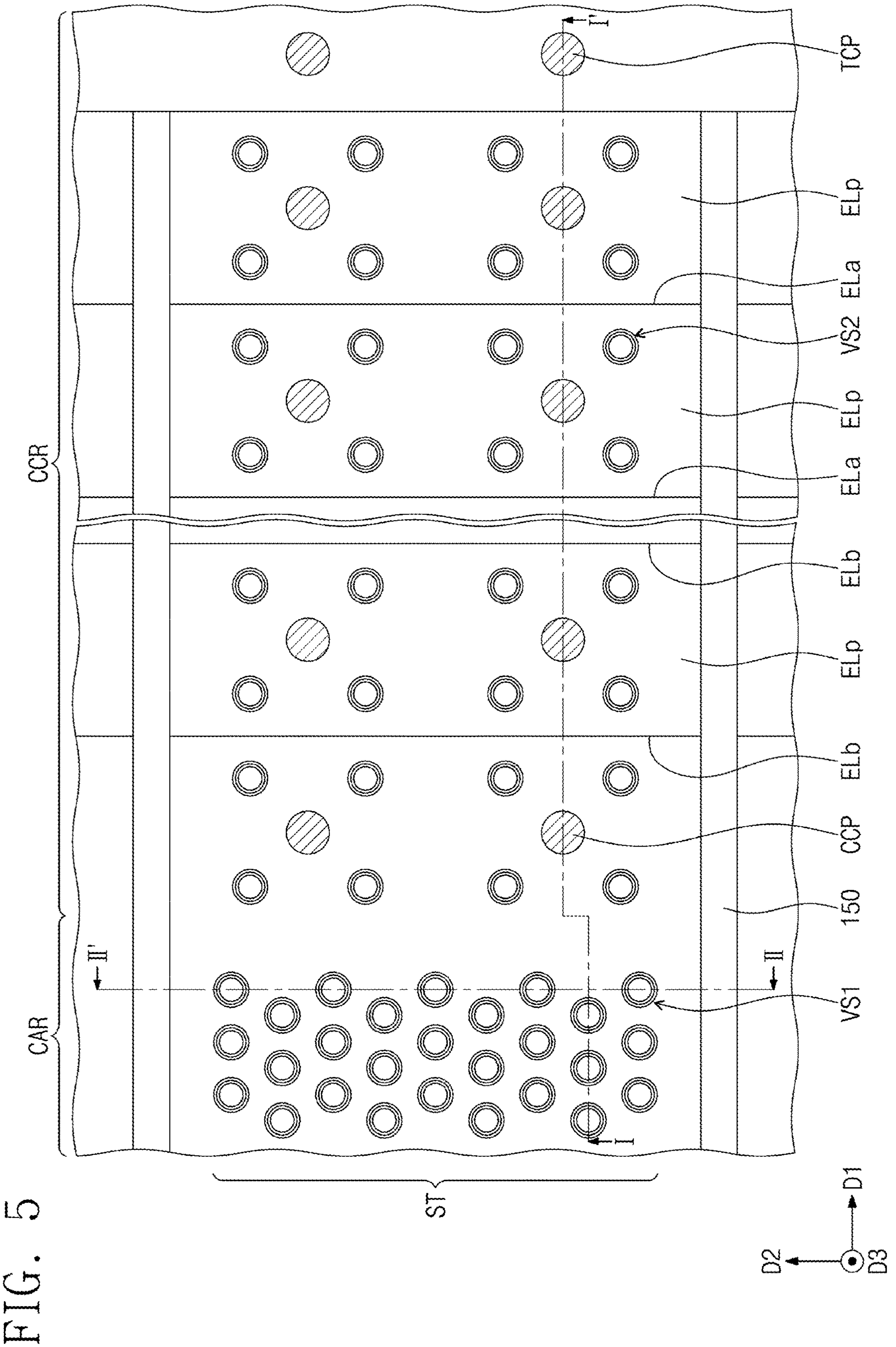
FIG. 5 is a plan view illustrating a three-dimensional semiconductor memory device according to an embodiment.
Figure 6A:
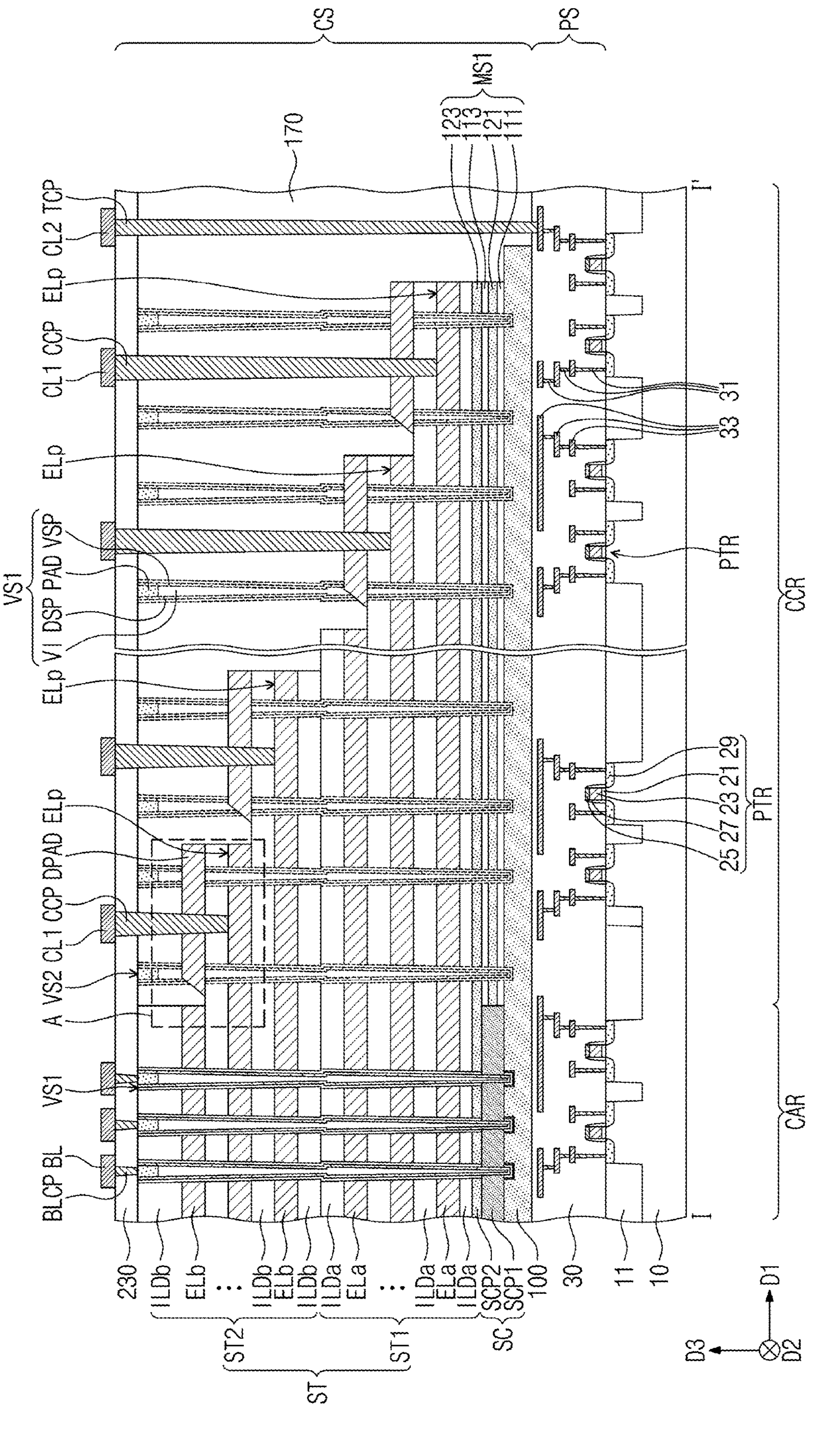
FIGS. 6A and 6B are sectional views, which are respectively taken along lines I-I' and II-IF of FIG. 5 to illustrate a three-dimensional semiconductor memory device according to an embodiment.
Figure 6B:
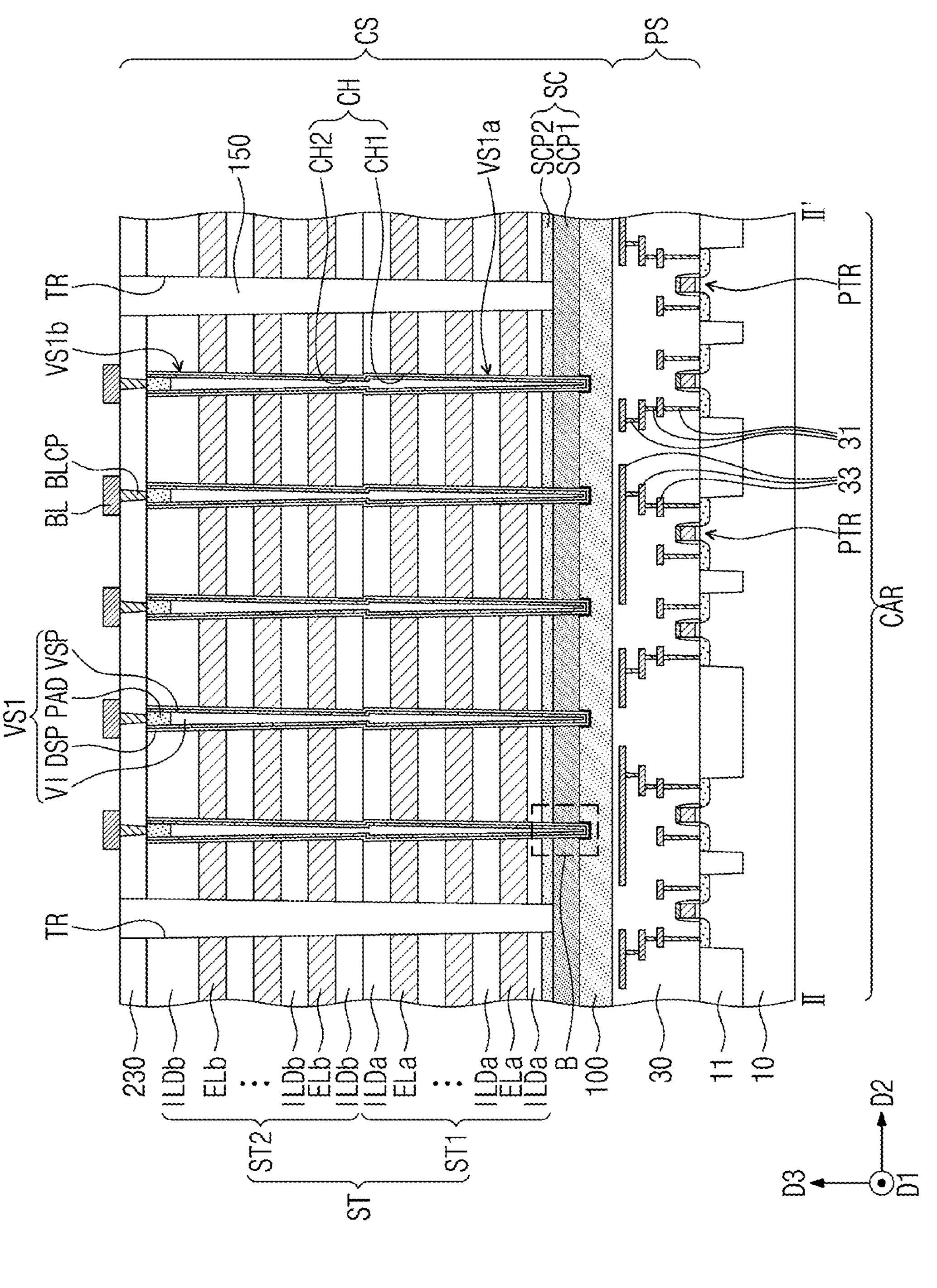

FIG. 5 is a plan view illustrating a three-dimensional semiconductor memory device according to an embodiment. FIGS. 6A and 6B are sectional views that are respectively taken along lines I-I' and II-IF of FIG. 5 to illustrate a three-dimensional semiconductor memory device according to an embodiment.

Referring to FIGS. 5, 6A, and 6B, a three-dimensional semiconductor memory device may include a first substrate 10, a peripheral circuit structure PS on the first substrate 10, and a cell array structure CS on the peripheral circuit structure PS. The first substrate 10, the peripheral circuit structure PS, and the cell array structure CS may correspond to the semiconductor substrate 3010, the first structure 3100 on the semiconductor substrate 3010, and the second structure 3200 on the first structure 3100, respectively, which are illustrated in FIGS. 3 and 4.

The first substrate 10 may include a cell array region CAR and a contact region CCR. In the present specification, a first direction D1 may be parallel to a top surface of the first substrate 10, a second direction D2 may be parallel to the top surface of the first substrate 10 but not parallel to the first direction D1, and a third direction D3 may be perpendicular to the top surface of the first substrate 10.

The first substrate 10 may extend in the first direction D1 from the cell array region CAR toward the contact region CCR and in the second direction D2 crossing the first direction D1. The top surface of the first substrate 10 may be orthogonal to the third direction D3 crossing the first and second directions D1 and D2. For example, the first, second, and third directions D1, D2, and D3 may be orthogonal to each other.

When viewed in a plan view, the contact region CCR may extend from the cell array region CAR in the first direction D1 or in a direction opposite to the first direction D1. The cell array region CAR may be a region on which the vertical channel structures 3220 described with reference to FIGS. 3 and 4, the separation structures 3230, and the bit lines 3240 electrically connected to the vertical channel structures 3220 are provided. The contact region CCR may be a region on which a stepwise structure including pad portions ELp is provided, as will be described below. Unlike that illustrated in the drawings, the contact region CCR may extend from the cell array region CAR in the second direction D2 or a direction opposite to the second direction D2.

In an embodiment, the first substrate 10 may be a silicon substrate, a silicon-germanium substrate, a germanium substrate, or a structure including a single-crystalline silicon substrate and a single crystalline epitaxial layer that is grown therefrom. A device isolation layer 11 may be provided in the first substrate 10. The device isolation layer 11 may define an active region of the first substrate 10. The device isolation layer 11 may be formed of, or include, as an example, silicon oxide.

The peripheral circuit structure PS may be provided on the first substrate 10. The peripheral circuit structure PS may include peripheral circuit transistors PTR on the active region of the first substrate 10, peripheral contact plugs 31, peripheral circuit interconnection lines 33 electrically connected to the peripheral circuit transistors PTR through the peripheral contact plugs 31, and a first insulating layer 30 enclosing them. The peripheral circuit structure PS may correspond to the first region 1100F of FIG. 1. The peripheral circuit interconnection lines 33 may correspond to the peripheral lines 3110 of FIGS. 3 and 4.

The peripheral circuit transistors PTR, the peripheral contact plugs 31, and the peripheral circuit interconnection lines 33 may constitute a peripheral circuit. For example, the peripheral circuit transistors PTR may be made up of the decoder circuit 1110, the page buffer 1120, and the logic circuit 1130 of FIG. 1. More specifically, each of the peripheral circuit transistors PTR may include a peripheral gate insulating layer 21, a peripheral gate electrode 23, a peripheral capping pattern 25, a peripheral gate spacer 27, and peripheral source/drain regions 29.

The peripheral gate insulating layer 21 may be provided between the peripheral gate electrode 23 and the first substrate 10. The peripheral capping pattern 25 may be provided on the peripheral gate electrode 23. The peripheral gate spacer 27 may cover side surfaces of the peripheral gate insulating layer 21, the peripheral gate electrode 23, and the peripheral capping pattern 25. The peripheral source/drain regions 29 may be provided in portions of the first substrate 10 that are located at both sides of the peripheral gate electrode 23.

The peripheral circuit interconnection lines 33 may be electrically connected to the peripheral circuit transistors PTR through the peripheral contact plugs 31. Each of the peripheral circuit transistors PTR may be an NMOS transistor or a PMOS transistor. In some implementations, a peripheral circuit transistor PTR may be a gate-all-around type transistor. A width of each of the peripheral contact plugs 31 in the first or second direction D1 or D2 may increase with increasing distance from the first substrate 10.

The peripheral contact plugs 31 and the peripheral circuit interconnection lines 33 may be formed of or include at least one of conductive materials (e.g., metallic materials).

The first insulating layer 30 may be provided on the top surface of the first substrate 10. The first insulating layer 30 may be provided on the first substrate 10 to cover the peripheral circuit transistors PTR, the peripheral contact plugs 31, and the peripheral circuit interconnection lines 33. The first insulating layer 30 may have a multi-layered structure including a plurality of insulating layers. For example, the first insulating layer 30 may include at least one of silicon oxide, silicon nitride, silicon oxynitride, and/or low-k dielectric materials.

The cell array structure CS may be provided on the first insulating layer 30. Referring to FIG. 6A, the cell array structure CS may include a second substrate 100 and a stack ST on the second substrate 100. The second substrate 100 may extend in the first and second directions D1 and D2. The second substrate 100 may be omitted from a portion of the contact region CCR. The second substrate 100 may be a semiconductor substrate including a semiconductor material. The second substrate 100 may be formed of or include at least one of silicon (Si), germanium (Ge), silicon germanium (SiGe), gallium arsenic (GaAs), indium gallium arsenic (InGaAs), or aluminum gallium arsenic (AlGaAs).

The stack ST may be provided on the second substrate 100. The stack ST may be extended from the cell array region CAR to the contact region CCR. The stack ST may correspond to the stacks 3210 of FIGS. 3 and 4. In an embodiment, a plurality of the stacks ST may be arranged in the second direction D2 and may be spaced apart from each other in the second direction D2 with a separation structure 150 interposed therebetween. For brevity's sake, just one stack ST will be described below, but the others of the stacks ST may have substantially the same features as described below.

The stack ST may include interlayer insulating layers ILDa and ILDb and gate electrodes ELa and ELb, which are alternately stacked. The gate electrodes ELa and ELb may correspond to the word lines WL, the first lines LL1 and LL2, and the second lines UL1 and UL2 of FIG. 1.

Specifically, the stack ST may include a first stack ST1 on the second substrate 100 and a second stack ST2 on the first stack ST1. The first stack ST1 may include first interlayer insulating layers ILDa and first gate electrodes Ela that are alternatively stacked. The second stack ST2 may include second interlayer insulating layers ILDb and second gate electrodes ELb, which are alternatively stacked. The first and second gate electrodes ELa and ELb may have substantially the same thickness in the third direction D3. Hereinafter, the term 'thickness' may be used to represent a length of an element in the third direction D3.

For the first and second gate electrodes ELa and ELb, a length in the first direction D1 may decrease with increasing distance from the second substrate 100 (i.e., with increasing distance in the third direction D3). That is, a length of each of the first and second gate electrodes ELa and ELb in the first direction D1 may be larger than a length of another electrode thereon in the first direction D1. The lowermost one of the first gate electrodes ELa of the first stack ST1 may have the longest length in the first direction D1, and the uppermost one of the second gate electrodes ELb of the second stack ST2 may have the shortest length in the first direction D1.

The first and second gate electrodes ELa and ELb may have the pad portions ELp, on the contact region CCR. The pad portions ELp of the first and second gate electrodes ELa and ELb may be disposed at positions that are different from each other in horizontal and vertical directions. The pad portions ELp may form a stepwise structure in the first direction D1.

Due to the stepwise structure, each of the first and second stacks ST1 and ST2 may have a thickness that decreases with increasing distance from the outermost one of first vertical channel structures VS1 to be described below. The side surfaces of the first and second gate electrodes ELa and ELb may be spaced apart from each other in the first direction D1 by a specific distance, when viewed in a plan view.

The first and second gate electrodes ELa and ELb may be formed of or include at least one of, for example, doped semiconductor materials (e.g., doped silicon and so forth), metallic materials (e.g., tungsten, copper, aluminum, and so forth), conductive metal nitrides (e.g., titanium nitride, tantalum nitride, and so forth), or transition metals (e.g., titanium, tantalum, and so forth). In an embodiment, the first and second gate electrodes ELa and ELb may be formed of or include tungsten.

The first and second interlayer insulating layers ILDa and ILDb may be provided between the first and second gate electrodes ELa and ELb Each of the insulating layers ILDa and ILDb may have a side surface that is aligned with a side surface of a corresponding one of the first and second gate electrodes ELa and ELb that is disposed thereunder and is in contact therewith. For example, the first and second interlayer insulating layers ILDa and ILDb may be provided such that a length in the first direction D1 decreases with increasing distance from the second substrate 100, similar to the decreasing length of the first and second gate electrodes ELa and ELb.

The lowermost one of the second interlayer insulating layers ILDb may be in contact with the uppermost one of the first interlayer insulating layers ILDa. In an embodiment, a thickness of each of the first and second interlayer insulating layers ILDa and ILDb may be smaller than a thickness of each of the first and second gate electrodes ELa and ELb. The lowermost one of the first interlayer insulating layers ILDa may be thinner than the others of the interlayer insulating layers ILDa and ILDb. Also, the uppermost one of the second interlayer insulating layers ILDb may be thicker than the others of the interlayer insulating layers ILDa and ILDb.

Except for the lowermost one of the first interlayer insulating layers ILDa and the uppermost one of the second interlayer insulating layers ILDb, the remaining ones of the interlayer insulating layers ILDa and ILDb may have substantially the same thickness. However the thicknesses of the first and second interlayer insulating layers ILDa and ILDb may be variously changed depending on requirements for the semiconductor device.

The first and second interlayer insulating layers ILDa and ILDb may be formed of or include at least one of, for example, silicon oxide, silicon nitride, silicon oxynitride, and/or low-k dielectric materials. For example, the first and second interlayer insulating layers ILDa and ILDb may be formed of or include high density plasma (HDP) oxide or tetraethylorthosilicate (TEOS).

Dummy pads DPAD may be provided on the pad portions ELp of the gate electrodes ELa and ELb. The dummy pads DPAD may be formed of or include at least one of, for example, doped semiconductor materials (e.g., doped silicon), metallic materials (e.g., tungsten, copper, and aluminum), conductive metal nitrides (e.g., titanium nitride and tantalum nitride), or transition metals (e.g., titanium and tantalum). In an embodiment, the dummy pads DPAD may be formed of or include tungsten.

A source structure SC may be provided between the second substrate 100 on the cell array region CAR and the lowermost one of the first interlayer insulating layers ILDa. The source structure SC may correspond to the common source line CSL of FIG. 1 and the common source line 3205 of FIGS. 3 and 4. The source structure SC may include a first source conductive pattern SCP1 and a second source conductive pattern SCP2, which are sequentially stacked on the second substrate 100. The second source conductive pattern SCP2 may be provided between the first source conductive pattern SCP1 and the lowermost one of the first interlayer insulating layers ILDa. A thickness of the first source conductive pattern SCP1 may be larger than a thickness of the second source conductive pattern SCP2. The first and second source conductive patterns SCP1 and SCP2 may be formed of or include a semiconductor material (e.g., silicon) or a doped semiconductor material. When the first and second source conductive patterns SCP1 and SCP2 include the doped semiconductor material, an impurity concentration of the first source conductive pattern SCP1 may be higher than an impurity concentration of the second source conductive pattern SCP2.

In some implementations, the first source conductive pattern SCP1 of the source structure SC may be provided only in the cell array region CAR and not in the contact region CCR. By contrast, the second source conductive pattern SCP2 of the source structure SC may extend from the cell array region CAR to the contact region CCR. Herein, the second source conductive pattern SCP2 on the contact region CCR may be referred to as a second semiconductor layer 123.

A first mold structure MS1 may be provided between the second substrate 100 in the contact region CCR and the lowermost one of the first interlayer insulating layers ILDa. The first mold structure MS1 may include a first buffer insulating layer 111, a first semiconductor layer 121, a second buffer insulating layer 113, and the second semiconductor layer 123, which are sequentially stacked on the second substrate 100.

The first semiconductor layer 121 may be provided between the second substrate 100 and the second semiconductor layer 123. The first buffer insulating layer 111 may be provided between the second substrate 100 and the first semiconductor layer 121. The second buffer insulating layer 113 may be provided between the first semiconductor layer 121 and the second semiconductor layer 123. A bottom surface of the first buffer insulating layer 111 may be substantially coplanar with a bottom surface of the first source conductive pattern SCP1. A top surface of the second buffer insulating layer 113 may be substantially coplanar with a top surface of the first source conductive pattern SCP1.

In an embodiment, the first and second buffer insulating layers 111 and 113 may be formed of or include silicon oxide. The first and second semiconductor layers 121 and 123 may be formed of or include a material having an etch selectivity with respect to a first barrier pattern Bal. For example, the first and second semiconductor layers 121 and 123 may be formed of or include a semiconductor material (e.g., silicon).

The first vertical channel structures VS1 may be provided to penetrate the stack ST and the source structure SC on the cell array region CAR. The first vertical channel structures VS1 may be provided to penetrate at least a portion of the second substrate 100, and a bottom surface of each of the first vertical channel structures VS1 may be located at a level lower than a top surface of the second substrate 100 and a bottom surface of the source structure SC. In other words, the first vertical channel structures VS1 may be in direct contact with the second substrate 100.

The first vertical channel structures VS1 may be arranged to form a zigzag shape in the first or second direction D1 or D2, when viewed in the plan view of FIG. 5. The first vertical channel structures VS1 may be omitted from the contact region CCR. The first vertical channel structures VS1 may correspond to the vertical channel structures 3220 of FIGS. 2 to 4. The first vertical channel structures VS1 may correspond to the channel regions of the first transistors LT1 and LT2, the memory cell transistors MCT, and the second transistors UT1 and UT2 of FIG. 1.

The first vertical channel structures VS1 may be provided in vertical channel holes CH penetrating the stack ST. Each of the vertical channel holes CH may include a first vertical channel hole CH1 penetrating the first stack ST1 and a second vertical channel hole CH2 penetrating the second stack ST2. The first and second vertical channel holes CH1 and CH2 of each of the vertical channel holes CH may be connected to each other in the third direction D3.

Each of the first vertical channel structures VS1 may include a first portion VS1*a* and a second portion VS1*b*. The first portion VS1*a* may be provided in the first vertical channel hole CH1, and the second portion VS1*b* may be provided in the second vertical channel hole CH2. The second portion VS1*b* may be disposed on and connected to the first portion VS1*a*.

For each of the first and second portions VS1*a* and VS1*b*, a width in the first or second direction D1 or D2 may increase with increasing distance in the third direction D3. The uppermost width of the first portion VS1*a* may be larger than the lowermost width of the second portion VS1*b*. In other words, a side surface of each of the first vertical channel structures VS1 may have a stepped structure near a boundary between the first portion VS1*a* and the second portion VS1*b*. However, embodiments are not limited to this example. In some implementations, the side surface of each of the first vertical channel structures VS1 may have three or more stepped portions at different levels or may have a flat shape without a stepped portion.

The first vertical channel structure VS1 may include a data storage pattern DSP and a vertical semiconductor pattern VSP, which are sequentially provided on an inner side surface of the vertical channel hole CH, a gapfill insulating pattern VI, which fills an internal space defined by the vertical semiconductor pattern VSP, and a conductive pad PAD on the gapfill insulating pattern VI. The conductive pad PAD may be provided in an empty space, which is defined or enclosed by the gapfill insulating pattern VI and the data storage pattern DSP (or the vertical semiconductor pattern VSP). In an embodiment, a top surface of each of the first vertical channel structures VS1 may have a circular, elliptical, or bar shape. The data storage pattern DSP may be disposed adjacent to the stack ST to cover side surfaces of the first and second interlayer insulating layers ILDa and ILDb and side surfaces of the first and second gate electrodes ELa and ELb. The vertical semiconductor pattern VSP may be provided to conformally cover an inner side surface of the data storage pattern DSP.

The vertical semiconductor pattern VSP may be provided between the data storage pattern DSP and the gapfill insulating pattern VI. The vertical semiconductor pattern VSP may be shaped like a bottom-closed pipe or macaroni. The data storage pattern DSP may also be shaped like a bottom-opened pipe or macaroni.

The vertical semiconductor pattern VSP may be formed of or include at least one of doped semiconductor materials or undoped or intrinsic semiconductor materials and may have a poly-crystalline or single-crystalline structure. As will be described with reference to FIG. 8, the vertical semiconductor pattern VSP may be in contact with a portion of the source structure SC. The conductive pad PAD may be formed of or include at least one of doped semiconductor materials or conductive materials.

A plurality of second vertical channel structures VS2 may be provided on the contact region CCR to penetrate a second insulating layer 170, the stack ST, and the first mold structure MS1. For example, the second vertical channel structures VS2 may be provided to penetrate the pad portions ELp of the first and second gate electrodes ELa and ELb. The second vertical channel structures VS2 may be provided near cell contact plugs CCP, which will be described below. The second vertical channel structures VS2 may be omitted from the cell array region CAR. The first and second vertical channel structures VS1 and VS2 may be formed at the same time and may have substantially the same structure. In some embodiments, the second vertical channel structures VS2 may not be provided.

The second insulating layer 170 may be provided on the contact region CCR to cover the stack ST and a portion of the first insulating layer 30. For example, the second insulating layer 170 may be provided on the pad portions ELp of the first and second gate electrodes ELa and ELb to cover the stepwise structure of the stack ST. The second insulating layer 170 may cover the dummy pads DPAD. The second insulating layer 170 may have a substantially flat top surface. The top surface of the second insulating layer 170 may be substantially coplanar with the topmost surface of the stack ST. For example, the top surface of the second insulating layer 170 may be substantially coplanar with a top surface of the uppermost one of the second interlayer insulating layers ILDb of the stack ST.

The second insulating layer 170 may include an insulating layer or a plurality of stacked insulating layers. The second insulating layer 170 may be formed of or include at least one of insulating materials (e.g., silicon oxide, silicon nitride, silicon oxynitride, and/or low-k dielectric materials). The second insulating layer 170 may be formed of or include an insulating material different from the first and second interlayer insulating layers ILDa and ILDb of the stack ST. In the case where the first and second interlayer insulating layers ILDa and ILDb of the stack ST include a high-density plasma oxide, the second insulating layer 170 may be formed of or include TEOS.

A third insulating layer 230 may be provided on the second insulating layer 170 and the stack ST. The third insulating layer 230 may cover the top surface of the second insulating layer 170, the top surface of the uppermost one of the second interlayer insulating layers ILDb of the stack ST, and the top surfaces of the first and second vertical channel structures VS1 and VS2.

The third insulating layer 230 may include an insulating layer or a plurality of stacked insulating layers. The third insulating layer 230 may be formed of or include at least one of, for example, silicon oxide, silicon nitride, silicon oxynitride, and/or low-k dielectric materials. The third insulating layer 230 may be formed of or include substantially the same insulating material as the second insulating layer 170 and may include an insulating material different from the first and second interlayer insulating layers ILDa and ILDb of the stack ST.

Bit line contact plugs BLCP may be provided to penetrate the third insulating layer 230. The bit line contact plugs BLCP may be connected to the first vertical channel structures VS1. The cell contact plugs CCP may be provided to penetrate the third insulating layer 230 and the second insulating layer 170 The cell contact plugs CCP may be connected to the first and second gate electrodes ELa and ELb. The cell contact plugs CCP may be provided to penetrate the dummy pads DPAD, respectively. Each of the cell contact plugs CCP may be provided to penetrate one of the first and second interlayer insulating layers ILDa and ILDb and may be in direct contact with one of the pad portions ELp of the first and second gate electrodes ELa and ELb. Each of the cell contact plugs CCP may be adjacent to a plurality of the second vertical channel structures VS2 and may be spaced apart from each other. The cell contact plugs CCP may correspond to the gate connection lines 3235 of FIG. 4.

A peripheral contact plug TCP may be provided to penetrate the third insulating layer 230, the second insulating layer 170, and at least a portion of the first insulating layer 30. The peripheral contact plug TCP may be electrically connected to the peripheral circuit transistor PTR of the peripheral circuit structure PS. A plurality of the peripheral contact plugs TCP may be provided, contrary to what is shown in the drawings. The peripheral contact plug TCP may be spaced apart from the second substrate 100, the source structure SC, and the stack ST in the first direction D1. The peripheral contact plug TCP may correspond to the penetration line 3245 of FIGS. 3 and 4.

For the bit line contact plugs BLCP, the cell contact plugs CCP, and the peripheral contact plug TCP, a width in the first or second direction D1 or D2 may increase with increasing distance in the third direction D3.

The bit lines BL may be provided on the third insulating layer 230 and may be connected to the bit line contact plugs BLCP, respectively. The bit lines BL may correspond to the bit line BL of FIG. 1 and the bit lines 3240 of FIGS. 3 and 4.

First conductive lines CL1 connected to the cell contact plugs CCP and second conductive line CL2 connected to the peripheral contact plug TCP may be provided on the third insulating layer 230. The first and second conductive lines CL1 and CL2 may correspond to the conductive lines 3250 of FIG. 4.

The bit line contact plugs BLCP, the cell contact plugs CCP, the peripheral contact plug TCP, the bit lines BL, and the first and second conductive lines CL1 and CL2 may be formed of or include at least one of conductive materials (e.g., metallic materials). Although not shown, the bit lines BL, additional interconnection lines and additional vias, which are electrically connected to the first and second conductive lines CL1 and CL2, may be further provided on the third insulating layer 230.

When a plurality of the stacks ST are provided, the separation structure 150 may be provided in a separation trench TR, which may be formed between the stacks ST. The separation trench TR may extend in the first direction D1 into the contact region CCR of the first substrate 10. The separation structure 150 may be spaced apart from the first and second vertical channel structures VS1 and VS2 in the second direction D2. For example, a top surface of the separation structure 150 may be located at a level that is higher than top surfaces of the first and second vertical channel structures VS1 and VS2. A bottom surface of the separation structure 150 may be substantially coplanar with the top surface of the first source conductive pattern SCP1 and may be located at a level higher than the top surface of the second substrate 100.

In an embodiment, a plurality of the separation structures 150 may be provided. In this case, the separation structures 150 may be spaced apart from each other in the second direction D2 with the stack ST interposed therebetween. The separation structure 150 may correspond to the separation structures 3230 of FIGS. 3 and 4.

The separation structure 150 may be provided to cover the side surfaces of the first and second interlayer insulating layers ILDa and ILDb, and the first and second gate electrodes ELa and ELb. The separation structure 150 may be formed of or include, silicon oxide, as an example.

Figure 7:
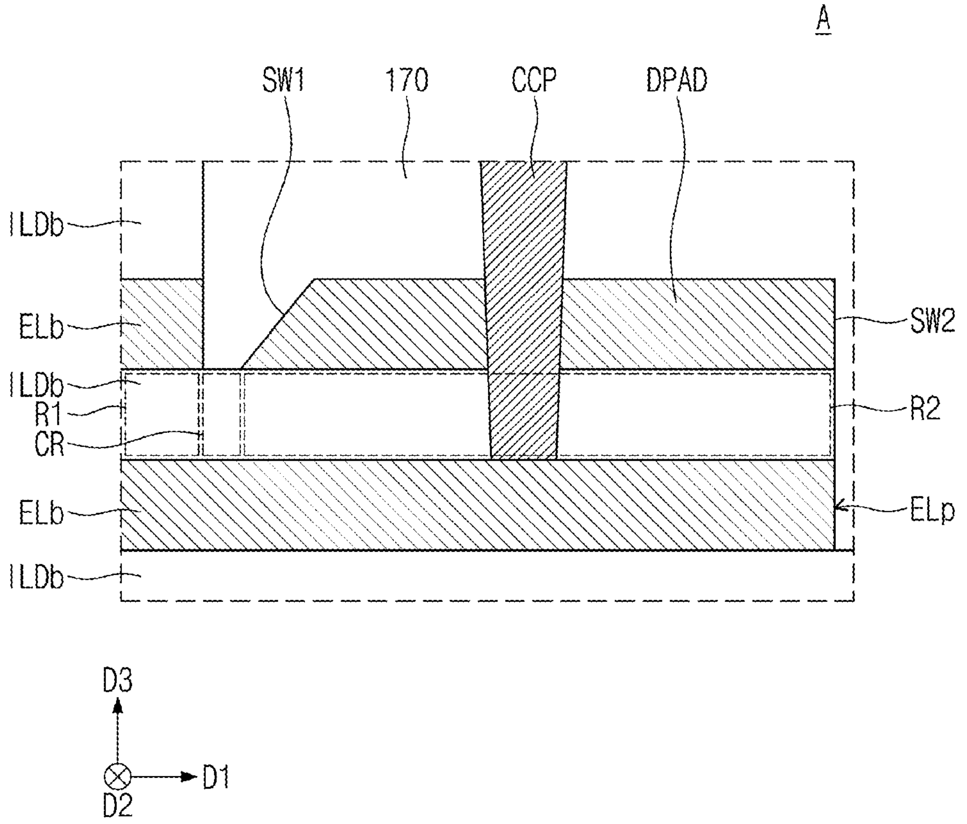
FIG. 7 is an enlarged sectional view illustrating a portion of a three-dimensional semiconductor memory device according to an embodiment The enlarged sectional view in FIG. 7 corresponds to a portion 'A' of FIG. 6A.

FIG. 7 is an enlarged sectional view illustrating a portion of a three-dimensional semiconductor memory device according to an embodiment. The enlarged sectional view corresponds to the portion 'A' of FIG. 6A.

Referring to FIGS. 6A and 7, the dummy pads DPAD may be spaced apart from the pad portions ELp of the gate electrodes ELa and ELb in the third direction D3. One of the interlayer insulating layers ILDa and ILDb may be interposed between the dummy pads DPAD and the pad portions ELp. In other words, the dummy pads DPAD and the pad portions ELp may be spaced apart from each other in the third direction D3 with one of the interlayer insulating layers ILDa and ILDb interposed therebetween. The cell contact plug CCP may be provided to penetrate one of the dummy pads DPAD and one of the interlayer insulating layers ILDa and ILDb and to be in contact with one of the pad portions ELp. The dummy pads DPAD may be electrically connected to the gate electrodes ELa and ELb, which include the pad portions ELp in contact with the cell contact plugs CCP, through the cell contact plugs CCP, respectively.

Each of the dummy pads DPAD may have a first side surface SW1 and a second side surface SW2, which are opposite to each other in the first direction D1. The first side surface SW1 may be a side surface of the dummy pad DPAD that is close to the cell array region CAR. The second side surface SW2 may be a side surface of the dummy pad DPAD that is opposite to the first side surface SW1 and is far from the cell array region CAR, compared to the first side surface SW1.

The first side surface SW1 of the dummy pad DPAD may be spaced apart from a side surface of a neighboring one of the gate electrodes ELa and ELb in the first direction D1. The second insulating layer 170 may be interposed between the first side surface SW1 of the dummy pad DPAD and the side surface of the neighboring one of the gate electrodes ELa and ELb, which are adjacent to each other in the first direction D1. In other words, the dummy pads DPAD and the gate electrodes ELa and ELb may be spaced apart from each other in the first direction D1 with the second insulating layer 170 interposed therebetween. The first side surface SW1 may be in contact with the second insulating layer 170. The dummy pads DPAD may be electrically disconnected from the gate electrodes ELa and ELb, which are adjacent thereto in the first direction D1. The dummy pads DPAD may be in contact with one of the interlayer insulating layers ILDa and ILDb.

The second side surface SW2 of each of the dummy pads DPAD may be aligned to the side surfaces of the interlayer insulating layers ILDa and ILDb and the pad portions ELp, which are placed below the dummy pads DPAD.

Each of the interlayer insulating layers ILDa and ILDb may include a connection portion CR, a first portion R1, and a second portion R2. The connection portion CR may be a portion that is vertically overlapped with a space between the dummy pad DPAD and the gate electrode ELa or ELb that are adjacent to the dummy pad DPAD in the first direction D1. The first portion R1 may be a portion that is vertically overlapped with the gate electrode ELa or ELb and that is adjacent to the dummy pad DPAD in the first direction D1. The second portion R2 may be a portion that is vertically overlapped with the dummy pad DPAD. The connection portion CR may be interposed between the first portion R1 and the second portion R2.

The connection portion CR of the interlayer insulating layer ILDa or ILDb may be exposed to the outside from the gate electrodes ELa and ELb and the dummy pads DPAD. The connection portion CR of the interlayer insulating layer ILDa or ILDb may be in contact with the second insulating layer 170. There may be no element disposed or inserted in the connection portion CR of the interlayer insulating layer ILDa or ILDb. In other words, the interlayer insulating layers ILDa and ILDb may be continuously extended from the first portion R1 to the second portion R2 via the connection portion CR.

A top surface DPAD of each of the dummy pads DPAD may be located at substantially the same level as a top surface EL_a of one of the gate electrodes ELa and ELb adjacent thereto in the first direction D1. In some implementations, the top surface DPAD_a of each of the dummy pads DPAD may be located at a level that is higher or lower than the top surface EL_a of one of the gate electrodes ELa and ELb adjacent thereto in the first direction D1. In other words, a thickness of the dummy pad DPAD may be equal to or different from thicknesses of the gate electrodes ELa and ELb.

In the three-dimensional semiconductor memory device according to an embodiment, the pad portion ELp of the gate electrode ELa or ELb may be spaced apart from the dummy pad DPAD by the interlayer insulating layer ILDa or ILDb, and the dummy pad DPAD may be spaced apart from the gate electrode ELa or ELb, which are adjacent thereto in the first direction D1. In an embodiment, the interlayer insulating layer ILDa or ILDb may extend continuously from the first portion R1, which is vertically overlapped with the gate electrode ELa or ELb adjacent to the dummy pad DPAD in the first direction D1, to the second portion R2, which is vertically overlapped with the dummy pad DPAD. Accordingly, the interlayer insulating layers ILDa and ILDb may serve as a barrier that prevents the pad portions ELp from being damaged in a wet etching process that is performed to form the dummy pads DPAD. Thus, it may be possible to improve electrical and reliability characteristics of the three-dimensional semiconductor memory device.

Figure 8:
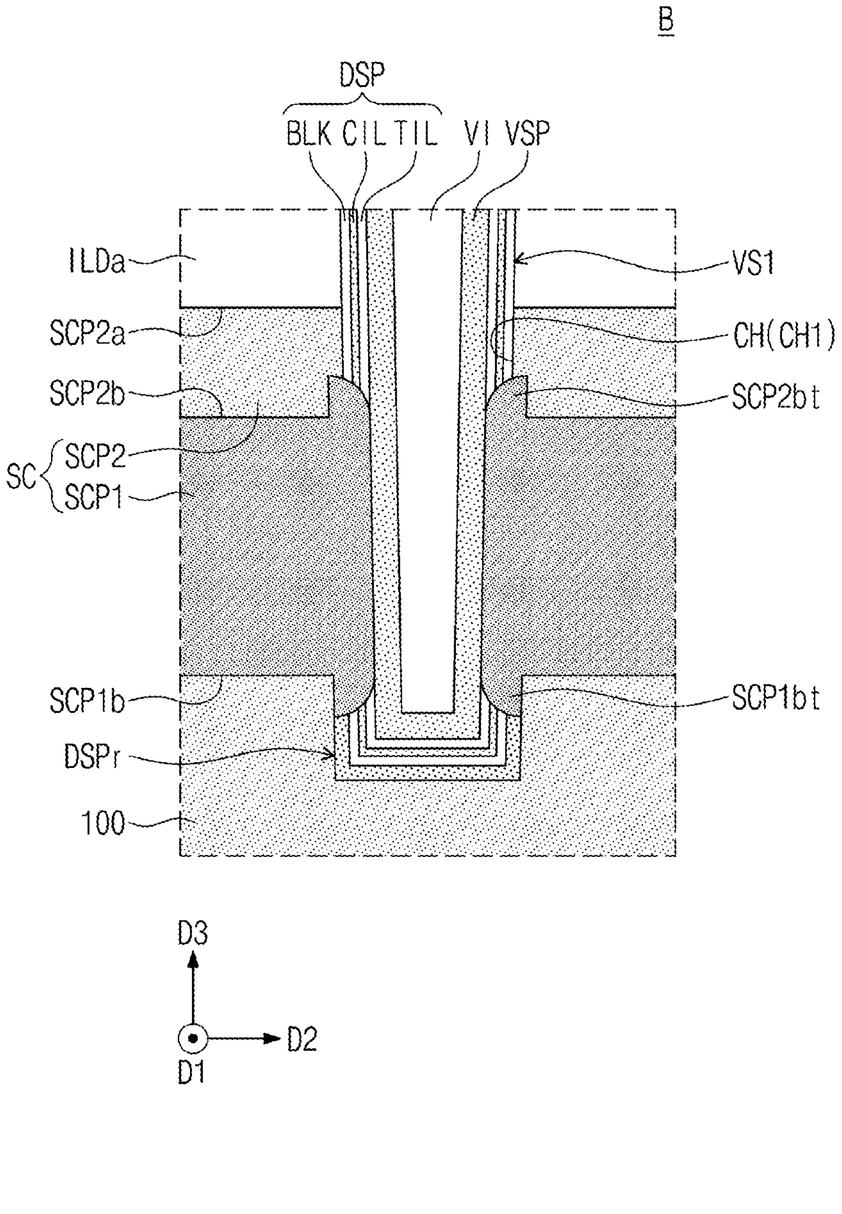
FIG. 8 is an enlarged sectional view illustrating a portion of a three-dimensional semiconductor memory device according to an embodiment. The enlarged sectional view in FIG. 8 corresponds to a portion 'B' of FIG. 6B.

FIG. 8 is an enlarged sectional view illustrating a portion of a three-dimensional semiconductor memory device according to an embodiment and corresponding to a portion 'B' of FIG. 6B.

FIG. 8 illustrates the source structure SC, which includes the first and second source conductive patterns SCP1 and SCP2, and one of the first vertical channel structures VS1, each of which includes the data storage pattern DSP, the vertical semiconductor pattern VSP, the gapfill insulating pattern VI, and a lower data storage pattern DSPr. For convenience in description, one of the stacks ST and one of the first vertical channel structures VS1 will be described. The remaining ones of the stacks ST and the first vertical channel structures VS1 may have substantially the same features as those to be described hereinafter.

Referring to FIG. 8, the data storage pattern DSP may include a blocking insulating layer BLK, a charge storing layer CIL, and a tunneling insulating layer TIL, which are sequentially stacked. The blocking insulating layer BLK may be adjacent to the stack ST or the source structure SC. The tunneling insulating layer TIL may be adjacent to the vertical semiconductor pattern VSP. The charge storing layer CIL may be interposed between the blocking insulating layer BLK and the tunneling insulating layer TIL. The blocking insulating layer BLK may conformally cover an inner surface of each of the vertical channel holes CH. The blocking insulating layer BLK may conformally cover the first and second interlayer insulating layers ILDa and ILDb and the first and second gate electrodes ELa and ELb.

The blocking insulating layer BLK, the charge storing layer CIL, and the tunneling insulating layer TIL may extend in the third direction D3. In an embodiment, the Fowler-Nordheim (FN) tunneling phenomenon, which is caused by a voltage difference between vertical semiconductor patterns VSP and first and second gate electrodes ELa and ELb, may be used to store or change data in the data storage pattern DSP. For example, the blocking insulating layer BLK and the tunneling insulating layer TIL may be formed of or include silicon oxide, and the charge storing layer CIL may be formed of or include silicon nitride or silicon oxynitride.

The first source conductive pattern SCP1 of the source structure SC may be in contact with the vertical semiconductor pattern VSP. The second source conductive pattern SCP2 may be spaced apart from the vertical semiconductor pattern VSP with the data storage pattern DSP interposed therebetween. The first source conductive pattern SCP1 may be spaced apart from the gapfill insulating pattern VI with the vertical semiconductor pattern VSP interposed therebetween.

For example, the first source conductive pattern SCP1 may include protruding portions SCP1*bt* that are located at a level higher than a bottom surface SCP2*b* of the second source conductive pattern SCP2 or lower than a bottom surface SCP1*b* of the first source conductive pattern SCP1. In some implementations, the protruding portions SCP1*bt* may be located at a level lower than a top surface SCP2*a* of the second source conductive pattern SCP2. A surface of the protruding portion SCP1*bt*, which is in contact with the data storage pattern DSP or the lower data storage pattern DSPr, may have a curved shape.

Figure 15:
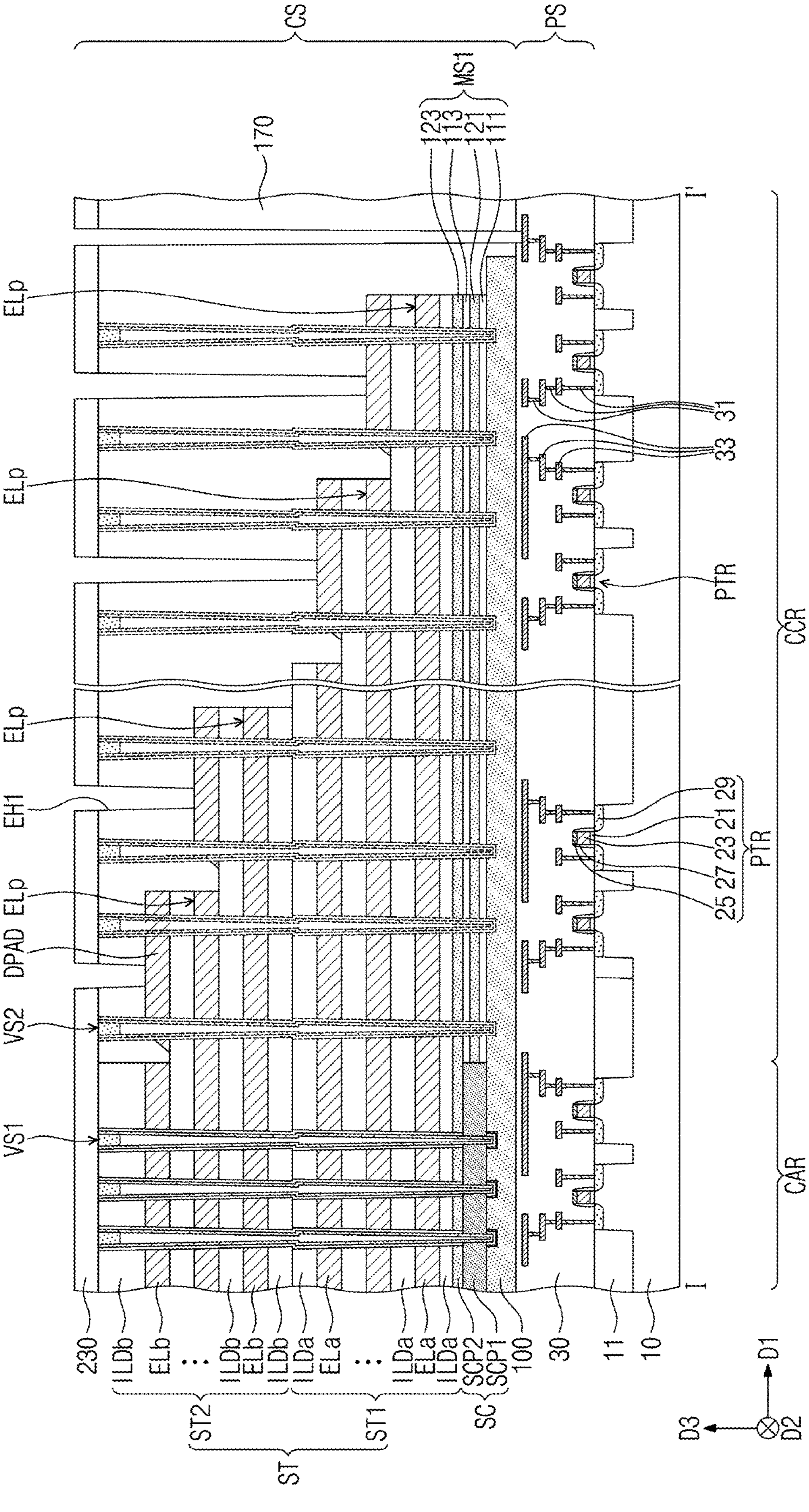
FIGS. 15 to 17 are sectional views, each of which is taken along the line I-I' of FIG. 5 to illustrate a method of fabricating a three-dimensional semiconductor memory device, according to an embodiment.
Figure 16:
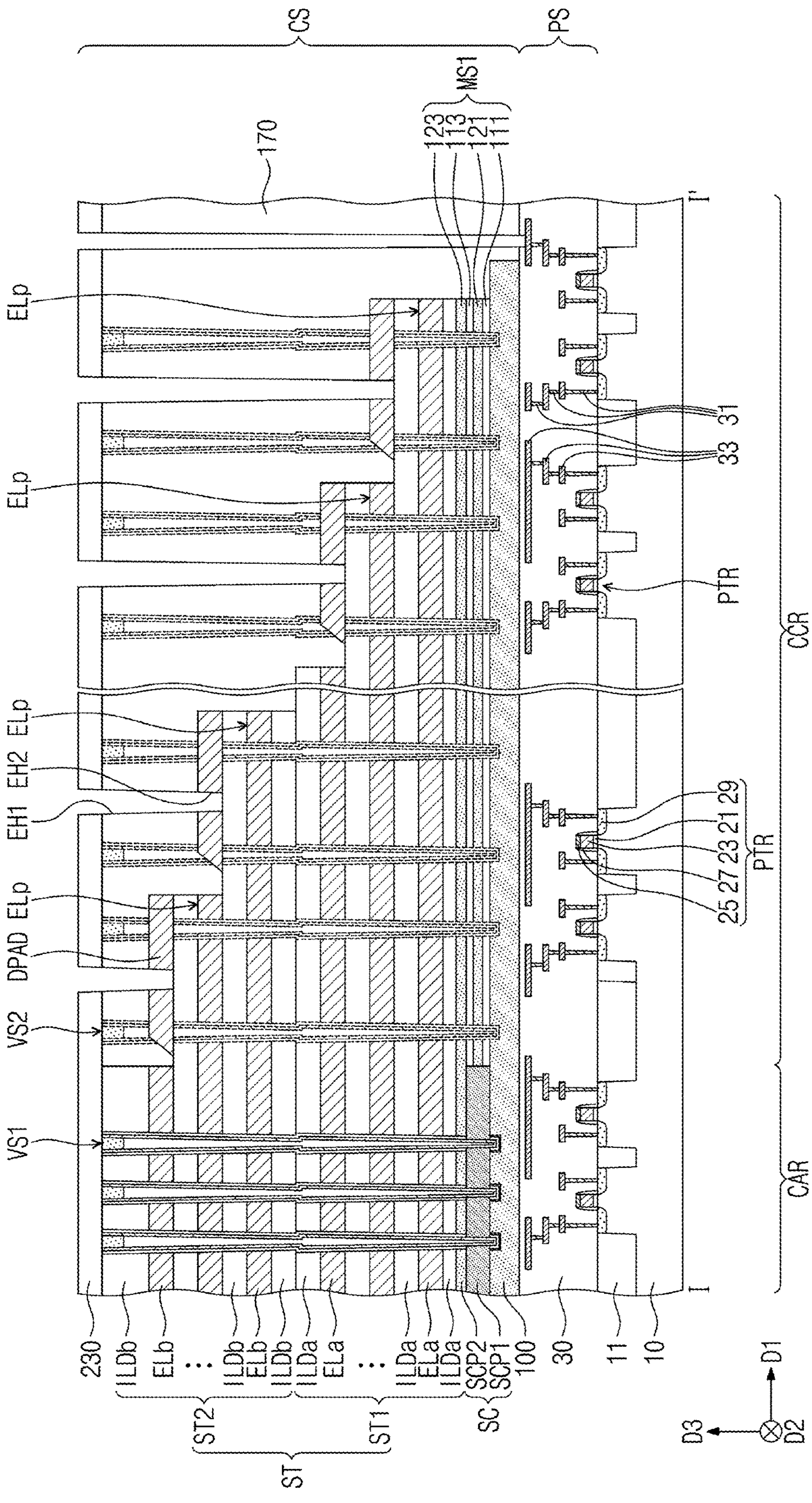
Figure 17:
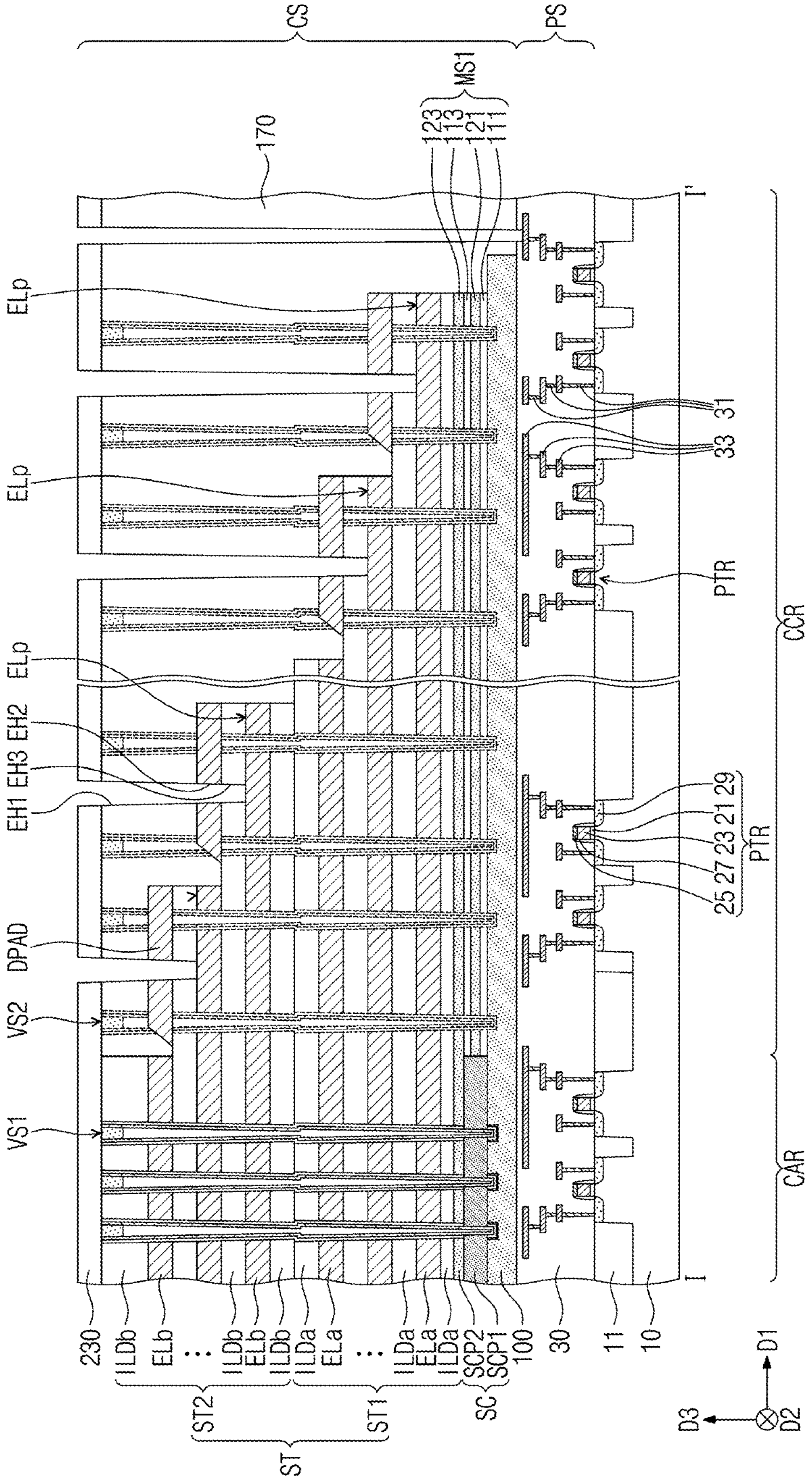

FIGS. 9A to 14A are sectional views, each of which is taken along the line I-I' of FIG. 5 to illustrate a method of fabricating a three-dimensional semiconductor memory device, according to an embodiment. FIGS. 9B to 14B are sectional views, each of which is taken along the line II-II' of FIG. 5 to illustrate a method of fabricating a three-dimensional semiconductor memory device, according to an embodiment. FIGS. 15 to 17 are sectional views, each of which is taken along the line I-I' of FIG. 5 to illustrate a method of fabricating a three-dimensional semiconductor memory device, according to an embodiment. Hereinafter, a method of fabricating a three-dimensional semiconductor memory device, according to an embodiment, will be described in more detail with reference to FIGS. 5, 6A, 6B, 9A to 14A, 9B to 14B, and 15 to 17.

Figure 9A:
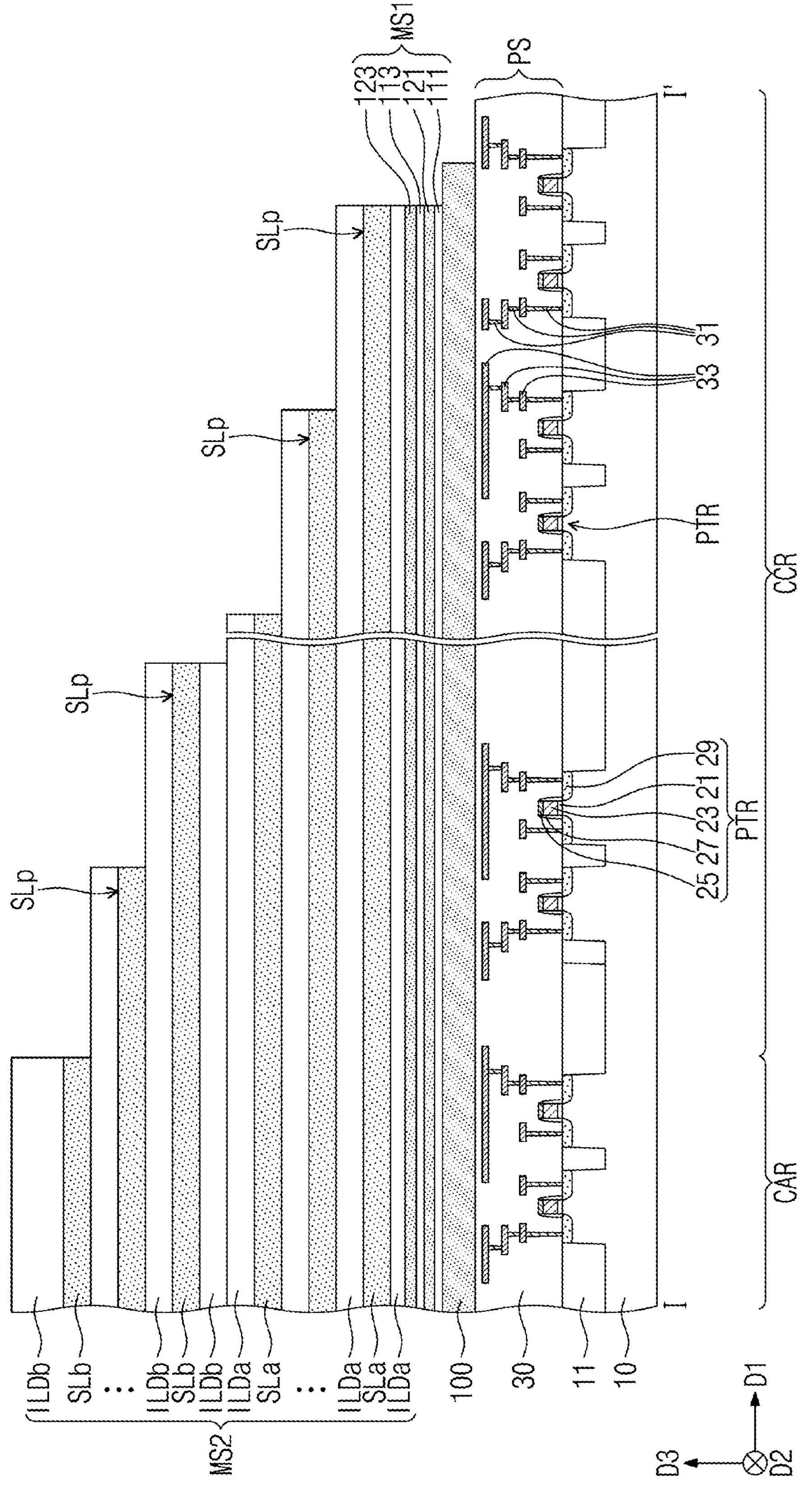
Figure 9B:
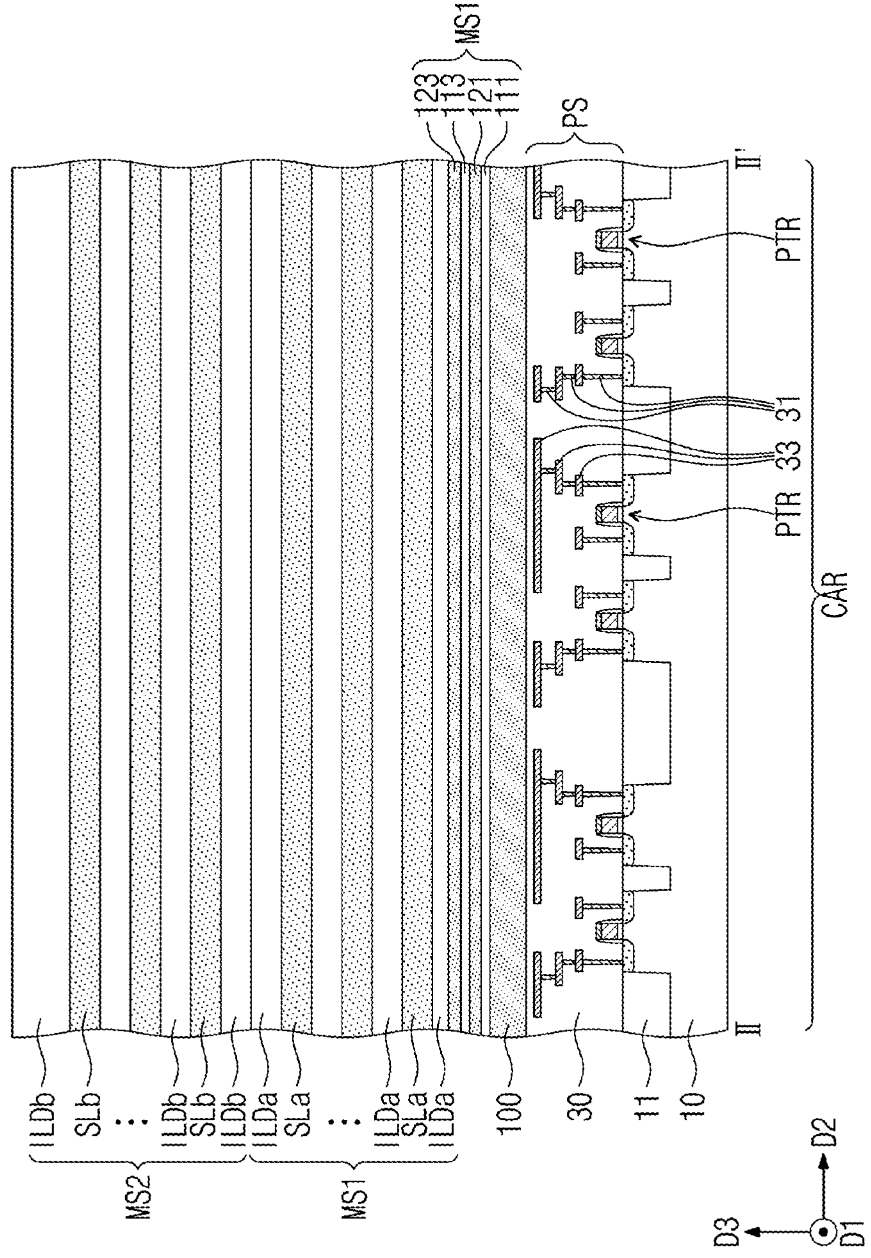

Referring to FIGS. 5, 9A, and 9B, the first substrate 10 including the cell array region CAR and the contact region CCR may be provided. The device isolation layer 11 may be formed in the first substrate 10 to define an active region. The formation of the device isolation layer 11 may include forming a trench in an upper portion of the first substrate 10 and filling the trench with a silicon oxide layer.

The peripheral circuit transistors PTR may be formed on the active region defined by the device isolation layer 11. The peripheral contact plugs 31 and the peripheral circuit interconnection lines 33 may be formed to be connected to the peripheral source/drain regions 29 of the peripheral circuit transistors PTR. The first insulating layer 30 may be formed to cover the peripheral circuit transistors PTR, the peripheral contact plugs 31, and the peripheral circuit interconnection lines 33.

The second substrate 100 may be formed on the first insulating layer 30. The second substrate 100 may extend from the cell array region CAR toward the contact region CCR.

A portion of the second substrate 100 on the contact region CCR may be removed. The partial removal of the second substrate 100 may include forming a mask pattern to cover a portion of the contact region CCR and the cell array region CAR and etching the second substrate 100 using the mask pattern as an etching mask. The partial removal of the second substrate 100 may be performed to form a region in which the peripheral contact plug TCP described above will be provided.

The first mold structure MS1 may be formed on the second substrate 100. The formation of the first mold structure MS1 may include sequentially stacking the first buffer insulating layer 111, the first semiconductor layer 121, the second buffer insulating layer 113, and the second semiconductor layer 123 on the second substrate 100. The first and second buffer insulating layers 111 and 113 may be formed of or include, for example, silicon oxide. The first and second semiconductor layers 121 and 123 may be formed of or include a semiconductor material (e.g., silicon).

A second mold structure MS2 may be formed on the first mold structure MS1. The formation of the second mold structure MS2 may include alternately stacking the first interlayer insulating layers ILDa and first sacrificial layers SLa on the second substrate 100 and alternately stacking second interlayer insulating layers ILDb and second sacrificial layers SLb on the uppermost one of the first interlayer insulating layers ILDa.

A trimming process may be performed on the second mold structure MS2 on the contact region CCR. The trimming process may include forming a mask pattern to cover a portion of the top surface of the second mold structure MS2 on the cell array region CAR and the contact region CCR, patterning the second mold structure MS2 using the mask pattern as a patterning mask, reducing an area of the mask pattern, and patterning the second mold structure MS2 using the mask pattern having the reduced area as a patterning mask. In an embodiment, the steps of reducing the area of the mask pattern and patterning the second mold structure MS2 using the mask pattern may be repeated several times during the trimming process. As a result of the trimming process, the second mold structure MS2 may have a stepwise structure. The second mold structure MS2 may have preliminary pad portions SLp constituting the stepwise structure.

The first and second sacrificial layers SLa and SLb may be formed of an insulating material different from the first and second interlayer insulating layers ILDa and ILDb. The first and second sacrificial layers SLa and SLb may be formed of or include a material having an etch selectivity with respect to the first and second interlayer insulating layers ILDa and ILDb. For example, the first and second sacrificial layers SLa and SLb may be formed of silicon nitride, and the first and second interlayer insulating layers ILDa and ILDb may be formed of silicon oxide. The first and second sacrificial layers SLa and SLb may be formed to have substantially the same thickness, and the first and second interlayer insulating layers ILDa and ILDb may have at least two different thicknesses depending on their vertical positions.

Figure 10A:
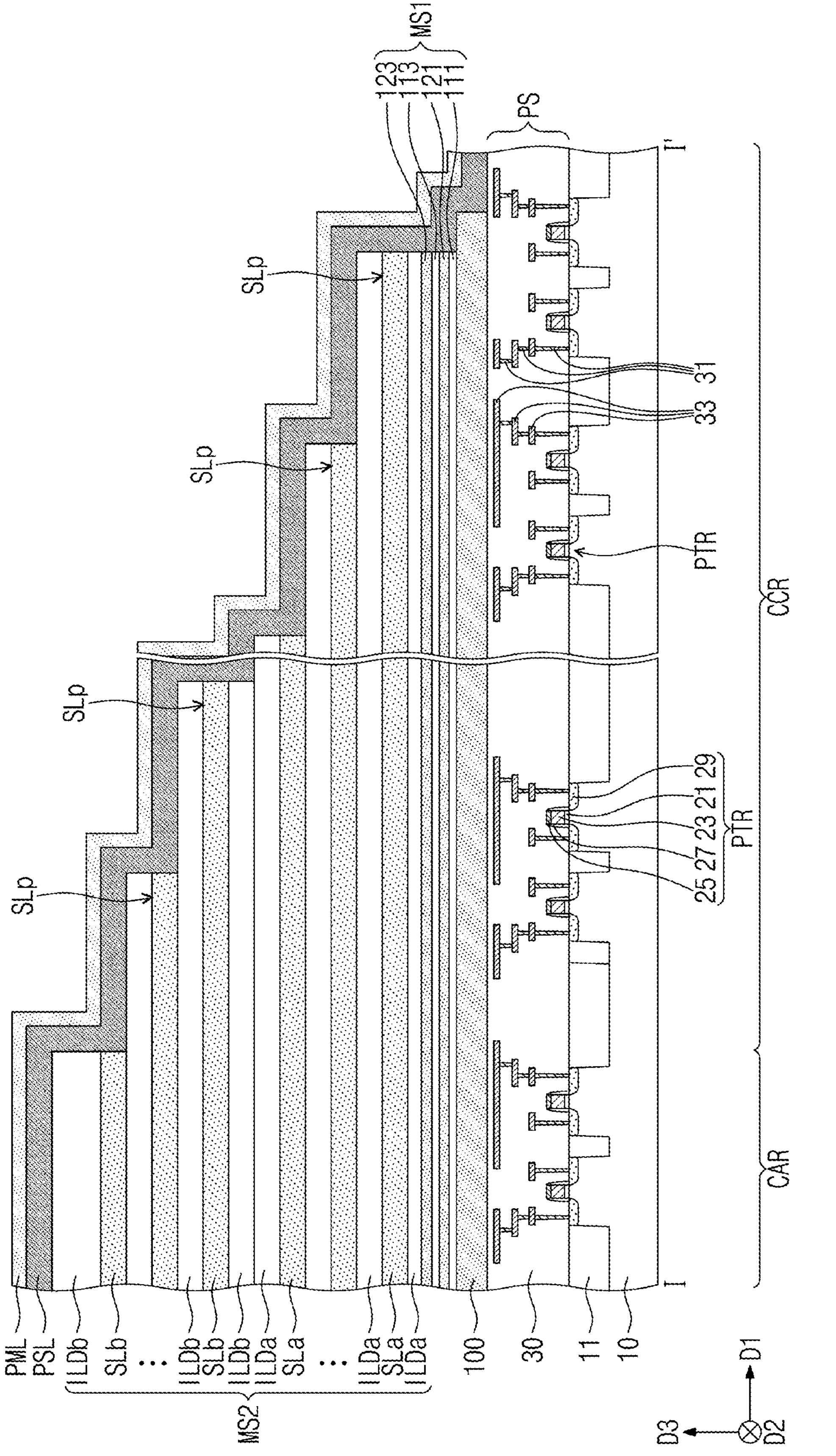
Figure 10B:
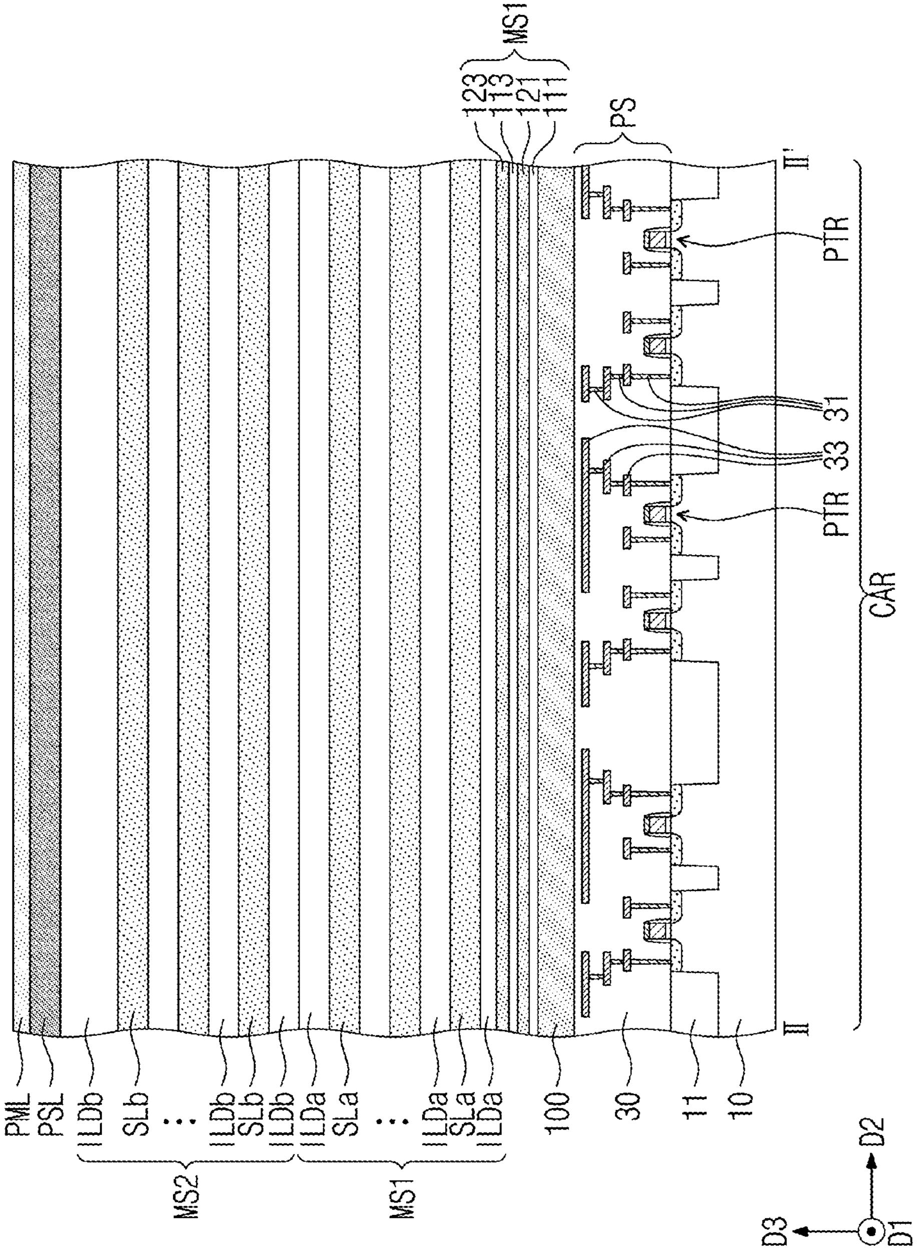

Referring to FIGS. 5, 10A, and 10B, a pad sacrificial layer PSL and a pad mask layer PML may be sequentially formed to cover the second mold structure MS2.

The pad sacrificial layer PSL and the pad mask layer PML may be conformally deposited on the second mold structure MS2. Portions of the first and second interlayer insulating layers ILDa and ILDb, which are vertically overlapped by the preliminary pad portions SLp, may not be removed before the deposition of the pad sacrificial layer PSL and the pad mask layer PML. In other words, the pad sacrificial layer PSL may be formed to cover the portions of the first and second interlayer insulating layers ILDa and ILDb that are vertically overlapped by the preliminary pad portions SLp.

The pad sacrificial layer PSL and the pad mask layer PML may be formed of or may include a material having an etch selectivity with respect to the first and second sacrificial layers SLa and SLb. In an embodiment, the pad sacrificial layer PSL and the pad mask layer PML may be formed of or include the same material as the first and second sacrificial layers SLa and SLb and may have an etch rate different from that of the first and second sacrificial layers SLa and SLb. The pad sacrificial layer PSL and the pad mask layer PML may be formed of or include a silicon nitride layer or a silicon oxynitride layer.

The pad sacrificial layer PSL may be formed of or include the same material as the first and second sacrificial layers SLa and SLb but may have an etch rate higher than the first and second sacrificial layers SLa and SLb. The pad mask layer PML may be formed of or include the same material as the first and second sacrificial layers SLa and SLb but may have an etch rate lower than the first and second sacrificial layers SLa and SLb.

The formation of the pad mask layer PML may include depositing a layer, which is formed of the same material as the pad sacrificial layer PSL, in an in-situ manner and performing a plasma treatment process on the deposited layer to change an etch rate of the deposited layer. Nitrogen ($N_2$) may be used in the plasma treatment process.

In the plasma treatment process, plasma having a highly anisotropic property may be provided on the pad mask layer PML. In this case, flat portions of the pad mask layer PML may be more exposed to the plasma than vertical portions. Accordingly, the flat and vertical portions of the pad mask layer PML may have different etch rates from each other. As an example, in the pad mask layer PML, an etch rate of the flat portions may be lower than an etch rate of the vertical portions.

Figure 11A:
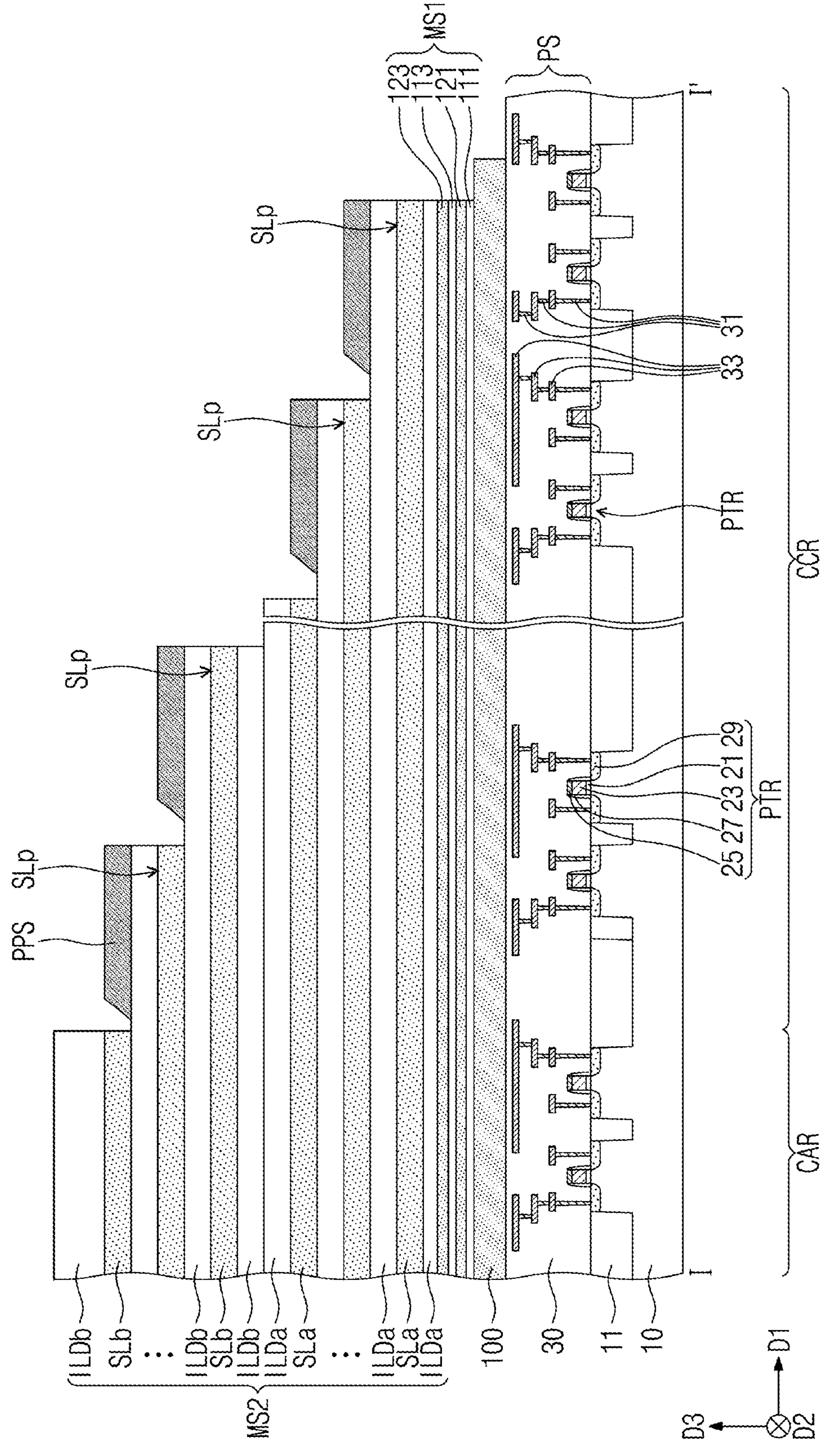
Figure 11B:
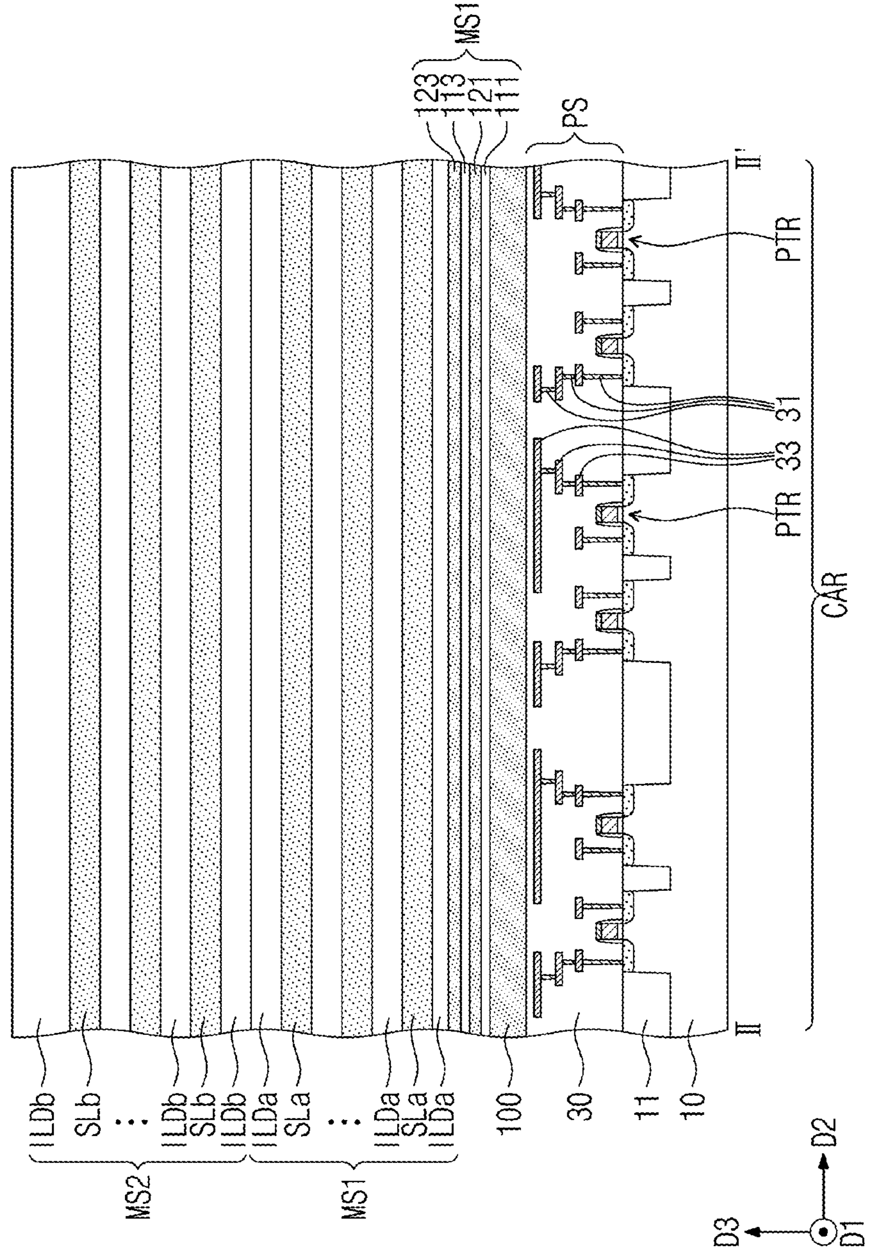

Referring to FIGS. 5, 11A, and 11B, after the plasma treatment process, a wet etching process may be performed on the pad mask layer PML and the pad sacrificial layer PSL. Due to a difference in etch rate between the flat and vertical portions of the pad mask layer PML in the wet etching process, portions of the pad sacrificial layer PSL may be left on top surfaces of stepped portions of the second mold structure MS2 to form preliminary sacrificial patterns PPS. The preliminary sacrificial patterns PPS may be formed on end portions of the first and second sacrificial layers SLa and SLb in the contact region CCR. The preliminary sacrificial patterns PPS may have an etch rate that is higher than the etch rate of the first and second sacrificial layers SLa and SLb. The preliminary sacrificial patterns PPS may be spaced apart from the preliminary pad portions SLp in the third direction D3.

Figure 12A:
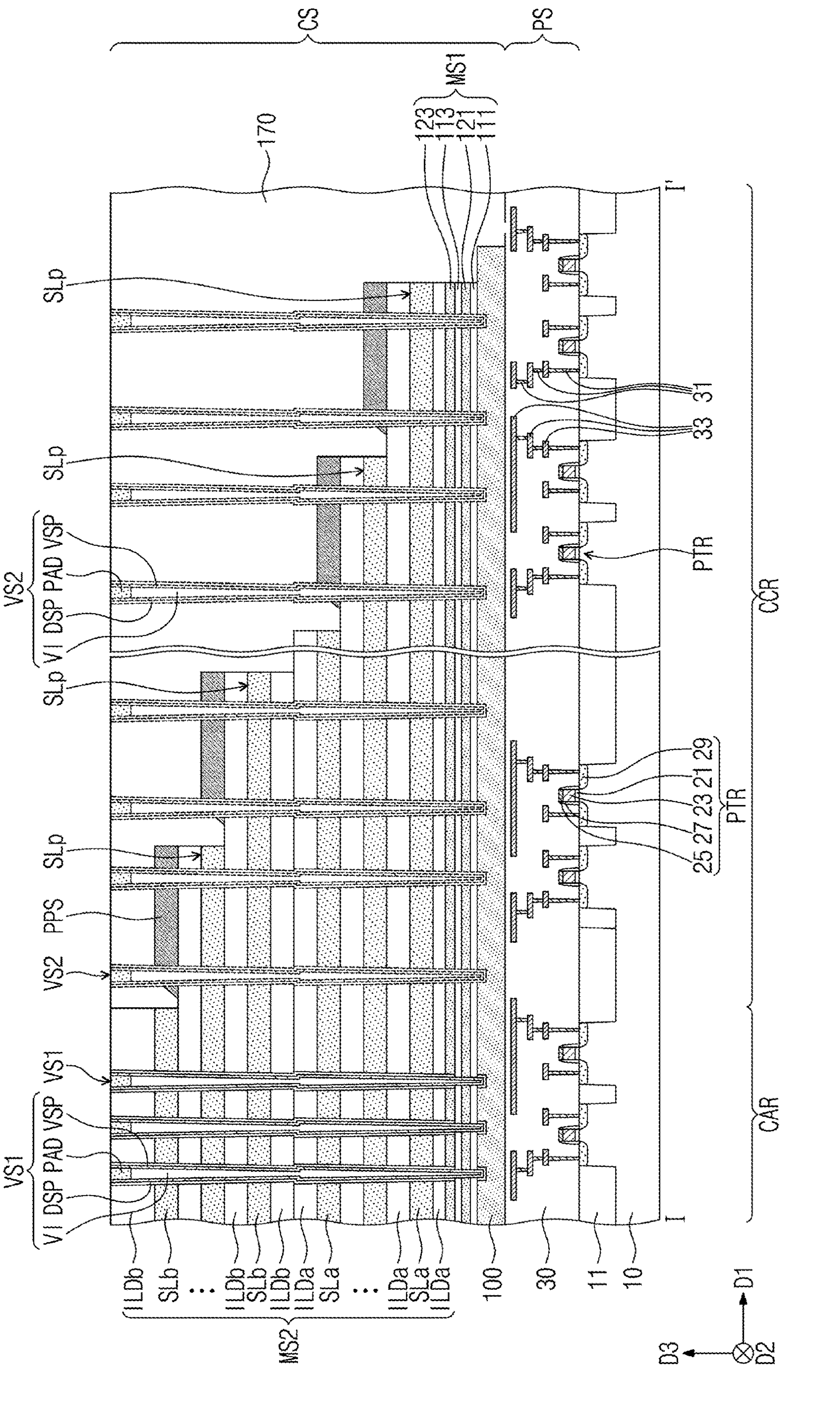
Figure 12B:
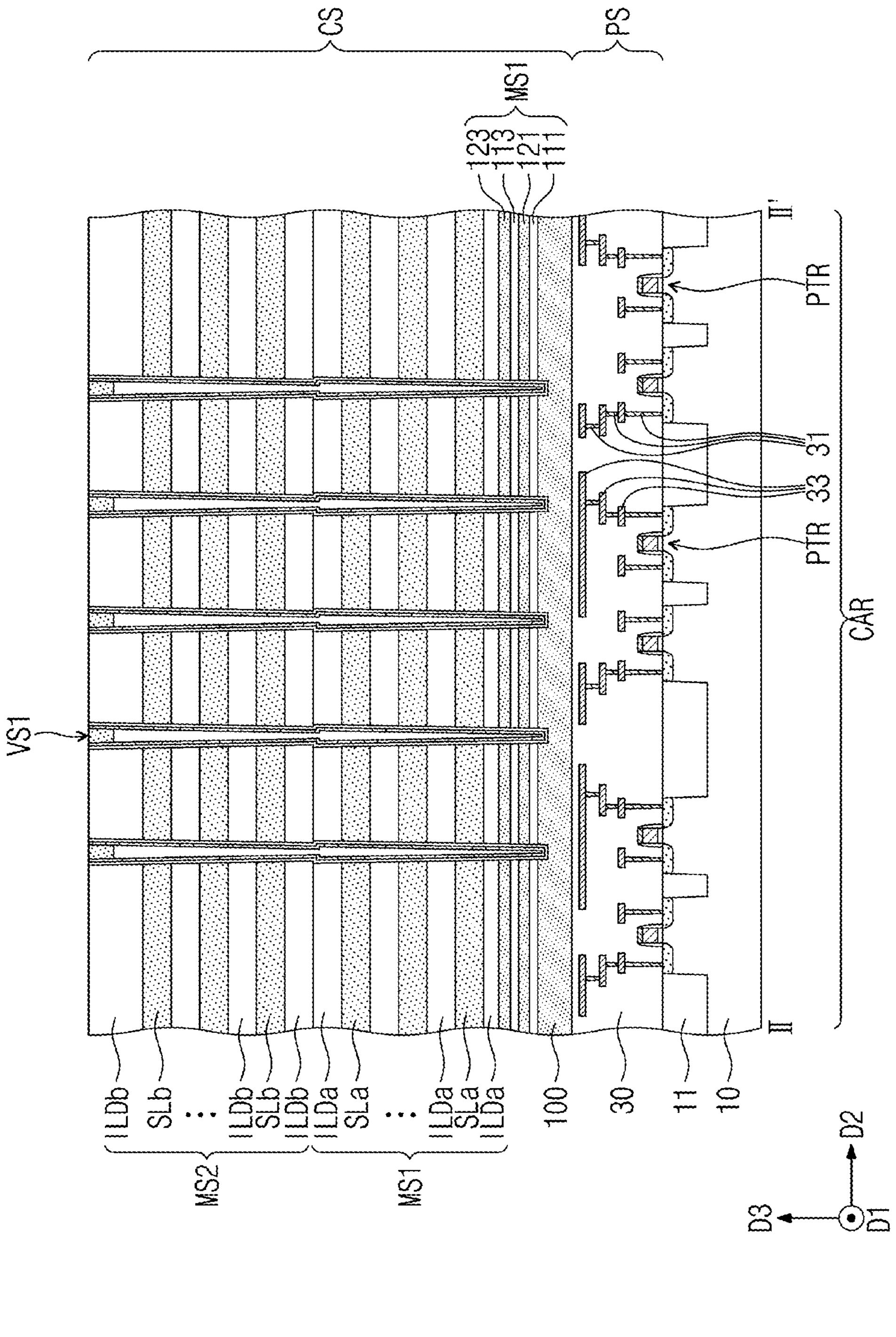

Referring to FIGS. 5, 12A, and 12B, the second insulating layer 170 may be formed on the second mold structure MS2. The second insulating layer 170 may enclose the second mold structure MS2. The second insulating layer 170 may cover a side surface of the first mold structure MS1, a portion of a top surface and a side surface of the second substrate 100, and a portion of a top surface of the first insulating layer 30.

Thereafter, the first and second vertical channel structures VS1 and VS2 may be formed in the cell array region CAR to penetrate the second mold structure MS2. The formation of the first and second vertical channel structures VS1 and VS2 may include forming vertical holes to penetrate the second mold structure MS2 and the first mold structure MS1 and sequentially depositing the data storage pattern DSP and the vertical semiconductor pattern VSP in each of the vertical holes. The vertical holes may include the first vertical channel hole CH1 and the second vertical channel hole CH2.

When the first and second vertical channel structures VS1 and VS2 are formed, bottom surfaces of the vertical holes may be at a level lower than the top surface of the second substrate 100.

The data storage pattern DSP may be deposited on bottom and side surfaces of the vertical holes using a chemical vapor deposition (CVD) method or an atomic layer deposition (ALD) method to have a uniform thickness. The data storage pattern DSP may include the tunneling insulating layer TIL, the charge storing layer CIL, and the blocking insulating layer BLK, which are sequentially stacked. The vertical semiconductor pattern VSP may be deposited on the data storage pattern DSP using a chemical vapor deposition (CVD) method or an atomic layer deposition (ALD) method to have a uniform thickness. After the formation of the data storage pattern DSP and the vertical semiconductor pattern VSP, the vertical holes may be filled with the gapfill insulating pattern VI. Thereafter, a planarization process may be performed on the gapfill insulating pattern VI, the vertical semiconductor pattern VSP, and the data storage pattern DSP to expose a top surface of the uppermost insulating layers ILDb of the second mold structure MS2. Accordingly, the data storage pattern DSP, the vertical semiconductor pattern VSP, and the gapfill insulating pattern VI may be formed as previously described with reference to FIG. 8.

The second vertical channel structures VS2 may be formed to penetrate the second insulating layer 170, the preliminary sacrificial patterns PPS, and the second mold structure MS2.

Figure 13A:
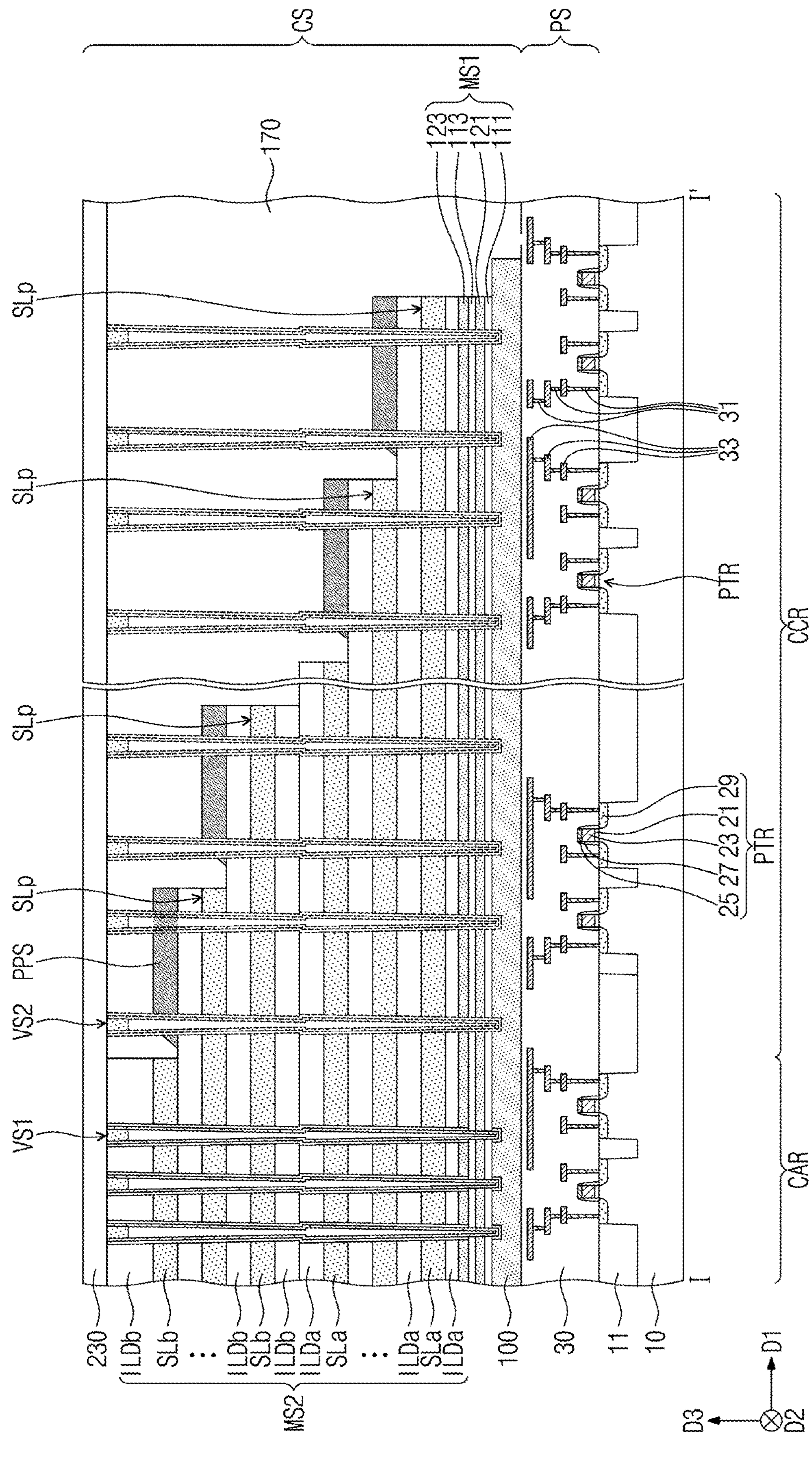
Figure 13B:
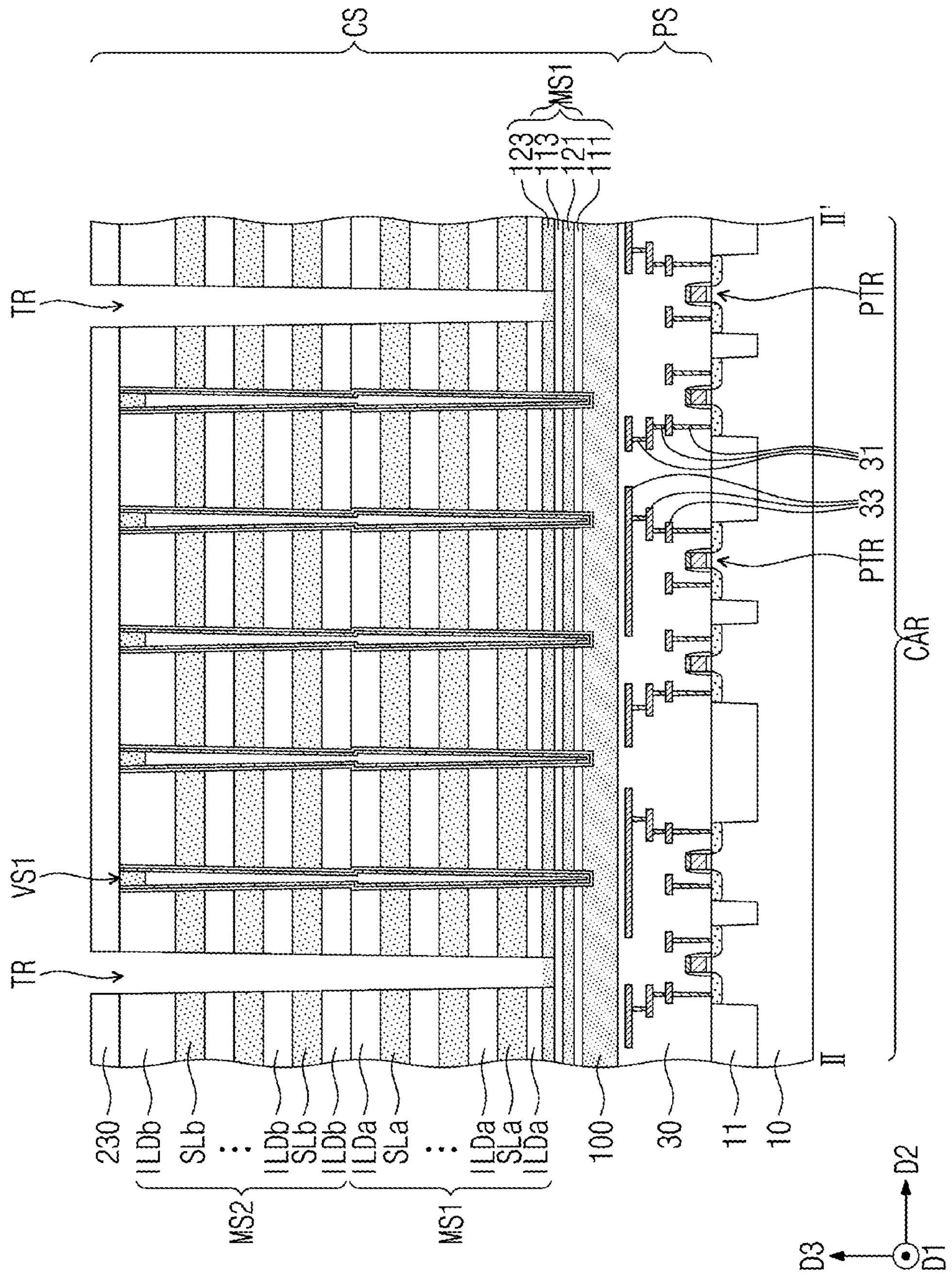

Referring to FIGS. 5, 13A, and 13B, the third insulating layer 230 may be formed on the second mold structure MS2 and the second insulating layer 170. The separation trench TR may be formed to penetrate the third insulating layer 230, the second insulating layer 170, and the second mold structure MS2. The separation trench TR may be formed to further penetrate at least a portion of the first mold structure MS1. In an embodiment, a bottom surface of the separation trench TR may be located at a level that is lower than a bottom surface of the second mold structure MS2 (i.e., a bottom surface of the lowermost one of the first interlayer insulating layers ILDa) and a top surface of the first mold structure MS1. The separation trench TR may be formed to expose the first semiconductor layer 121. Although not shown, a spacer may be provided to cover side surfaces of the first and second interlayer insulating layers ILDa and ILDb, side surfaces of the first and second sacrificial layers SLa and SLb, and a side surface of the second semiconductor layer 123. The separation trench TR may extend from the cell array region CAR toward the contact region CCR.

Figure 14A:
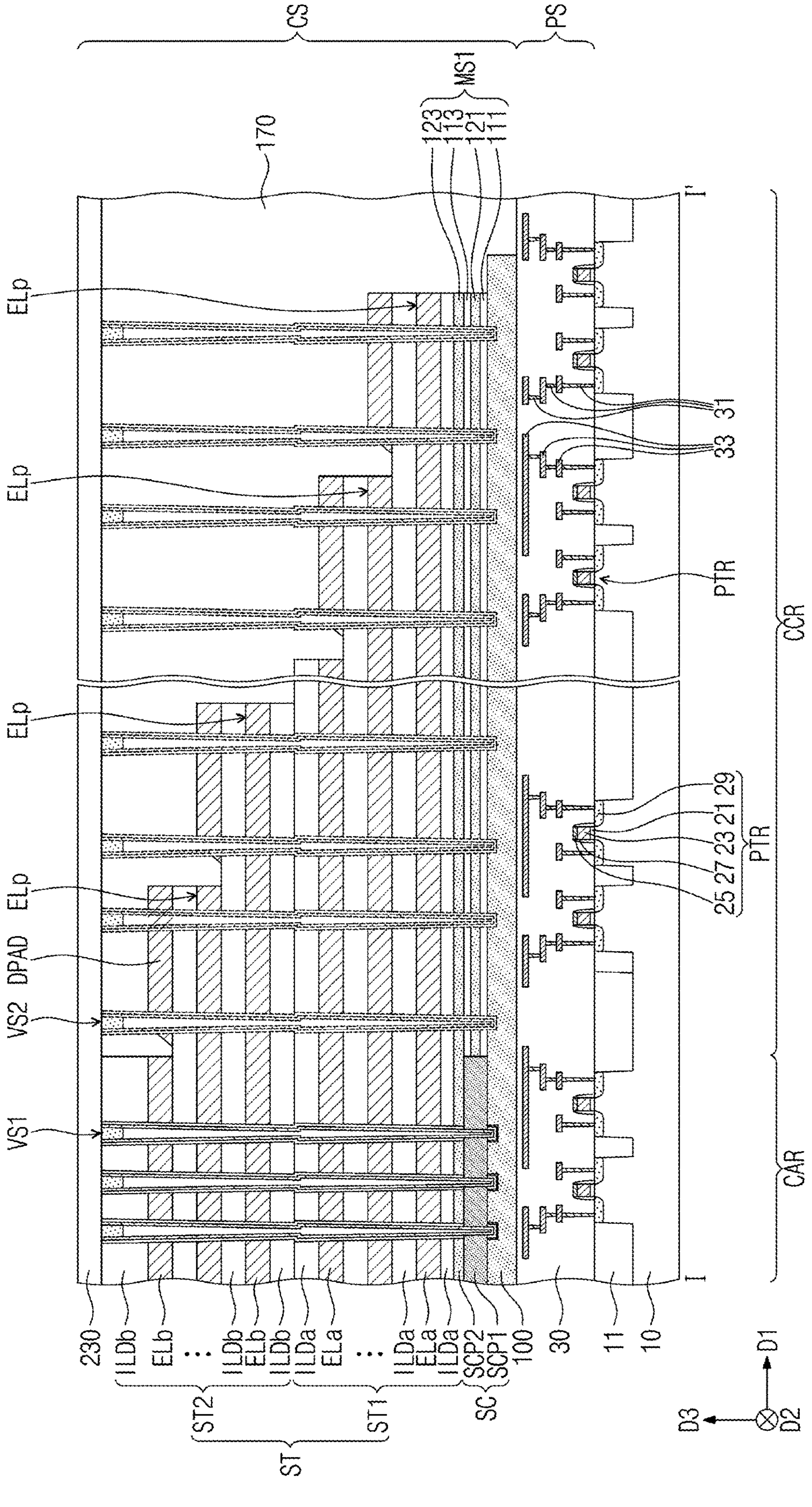
Figure 14B:
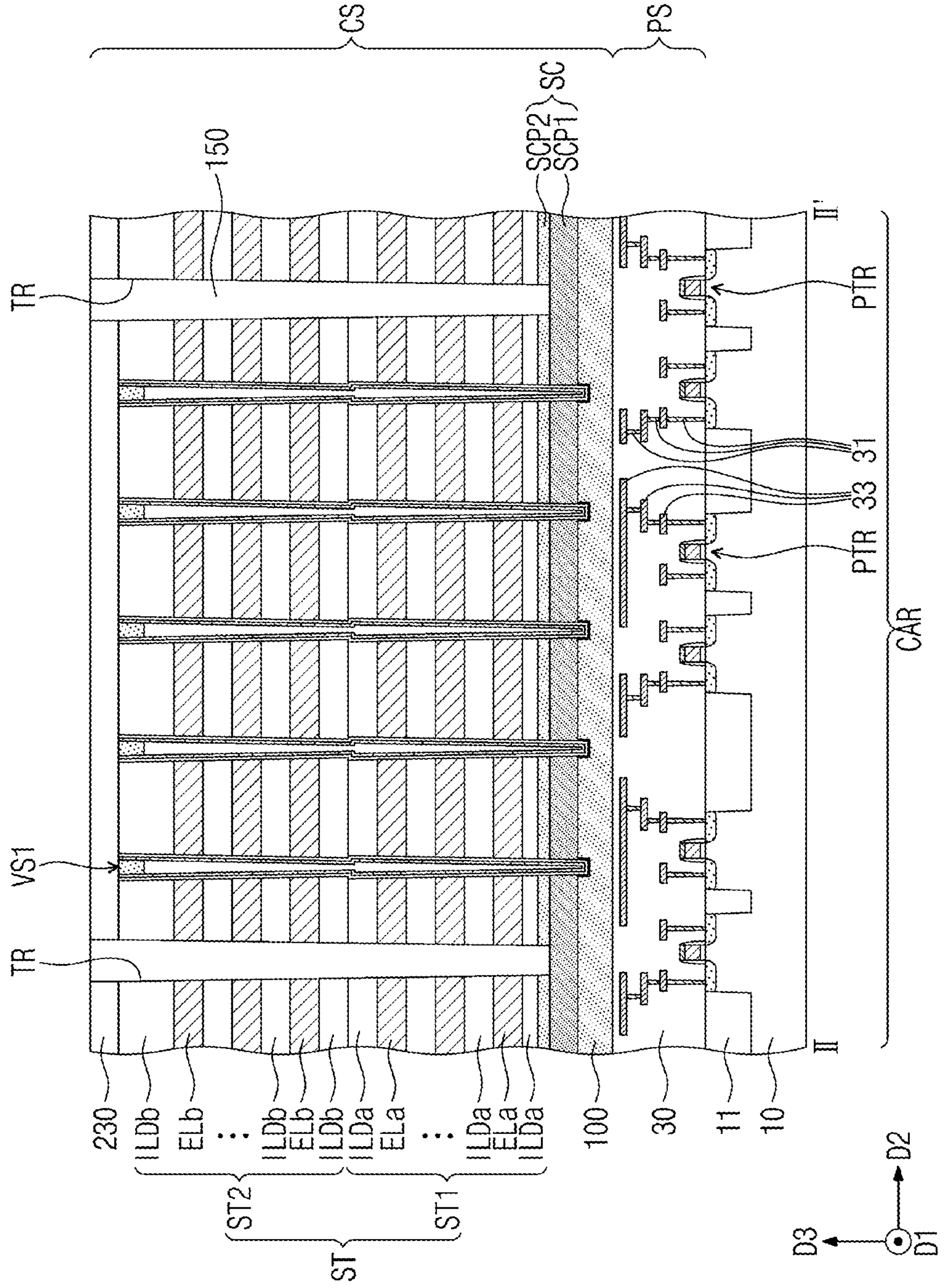

Referring to FIGS. 5, 14A, and 14B, an empty space may be formed by removing the first buffer insulating layer 111, the first semiconductor layer 121, and the second buffer insulating layer 113, which are exposed by the separation trench TR in the cell array region CAR. During this process, the data storage pattern DSP of the first vertical channel structures VS1 may be partially removed. The first source conductive pattern SCP1 may be formed in the empty space. A portion of the vertical semiconductor pattern VSP of the first vertical channel structures VS1 may be in contact with the first source conductive pattern SCP1. The second semiconductor layer 123 on the cell array region CAR may be referred to as the second source conductive pattern SCP2. By the process described above, the source structure SC including the first and second source conductive patterns SCP1 and SCP2, may be formed.

Thereafter, the spacer described with reference to FIGS. 13A and 13B may be removed, and then, the first and second sacrificial layers SLa and SLb exposed by the separation trench TR may be selectively removed. The preliminary sacrificial patterns PPS may also be removed during this process. The selective removal of the preliminary sacrificial patterns PPS and the first and second sacrificial layers SLa and SLb may be performed through a wet etching process using an etching solution. The dummy pads DPAD may be formed to fill empty spaces, which are formed due to the removing of the preliminary sacrificial patterns PPS. The first and second gate electrodes ELa and ELb may be formed to fill empty spaces that are formed by removing the first and second sacrificial layers SLa and SLb. As a result, the dummy pads DPAD and the stack ST, which includes the first and second gate electrodes ELa and ELb and the first and second interlayer insulating layers ILDa and ILDb, may be formed.

The separation structure 150 may be formed to fill the separation trench TR. A top surface of the separation structure 150 may be substantially coplanar with a top surface of the third insulating layer 230.

Referring to FIGS. 5 and 15, first vertical penetration holes EH1 may be formed on the contact region CCR to penetrate the third insulating layer 230 and the second insulating layer 170. The first vertical penetration hole EH1 may be formed to expose a top surface of each of the dummy pads DPAD. The first vertical penetration holes EH1 may be formed through a dry etching process.

Referring to FIGS. 5 and 16, second vertical penetration holes EH2 may be formed to penetrate the dummy pads DPAD. The second vertical penetration holes EH2 may be connected to the first vertical penetration holes EH1 described with reference to FIG. 15. The second vertical penetration hole EH2 may be formed to expose a portion of a top surface of each of the first and second interlayer insulating layers ILDa and ILDb, which are vertically overlapped with the dummy pads DPAD. The second vertical penetration holes EH2 may be formed through a dry etching process.

Referring to FIGS. 5 and 17, third vertical penetration holes EH3 may be formed to penetrate the first and second interlayer insulating layers ILDa and ILDb. The third vertical penetration hole EH3 may be formed to expose a portion of the top surface of each of the pad portions ELp of the gate electrodes ELa and ELb. The third vertical penetration holes EH3 may be connected to the second vertical penetration holes EH2.

Referring back to FIGS. 5, 6A, and 6B, the cell contact plugs CCP may be formed to fill the first to third vertical penetration holes EH1, EH2, and EH3. The cell contact plugs CCP may cover inner side surfaces of the first to third vertical penetration holes EH1, EH2, and EH3, respectively. The cell contact plug CCP may be in contact with an inner side surface of the dummy pad DPAD and a top surface of the pad portion ELp. For example, each of the cell contact plugs CCP may electrically connect one dummy pad DPAD to one pad portion ELp corresponding thereto.

The peripheral contact plug TCP may be formed to penetrate the third insulating layer 230 and the second insulating layer 170. The peripheral contact plug TCP may be formed to further penetrate a portion of the first insulating layer 30. The cell contact plugs CCP and the peripheral contact plug TCP may be formed at the same time.

The bit line contact plugs BLCP may be formed to penetrate the third insulating layer 230. Then, the bit lines BL, the first conductive lines CL1, and the second conductive line CL2 may be formed on the third insulating layer 230 to be connected to the bit line contact plugs BLCP, the cell contact plugs CCP, and the peripheral contact plug TCP, respectively. As a result, a three-dimensional semiconductor memory device may be fabricated.

In the method of fabricating a three-dimensional semiconductor memory device according to an embodiment, the dummy pads DPAD may be formed without removing the interlayer insulating layers ILDa and ILDb on the pad portions ELp of the gate electrodes ELa and ELb. Thus, the dummy pads DPAD may be formed by a separate process that is different from that for the gate electrodes ELa and ELb This may make it possible to freely control the thickness of the dummy pad DPAD, regardless of the thicknesses of the gate electrodes ELa and ELb. In the case where the thickness of the dummy pad DPAD is increased, it may be possible to increase a process time in a wet etching process that is performed to form the dummy pads DPAD, and thereby to effectively prevent a short circuit from being formed between the gate electrodes ELa and ELb. Thus, it may be possible to improve the electrical and reliability characteristics of the three-dimensional semiconductor memory device.

In addition, in the case where the thickness of the dummy pad DPAD is increased, it may be possible to reduce a process difficulty in the process of forming the cell contact plugs CCP that are in contact with the pad portions ELp. Accordingly, a three-dimensional semiconductor memory device may be fabricated more easily and cost-effectively.

Figure 18:
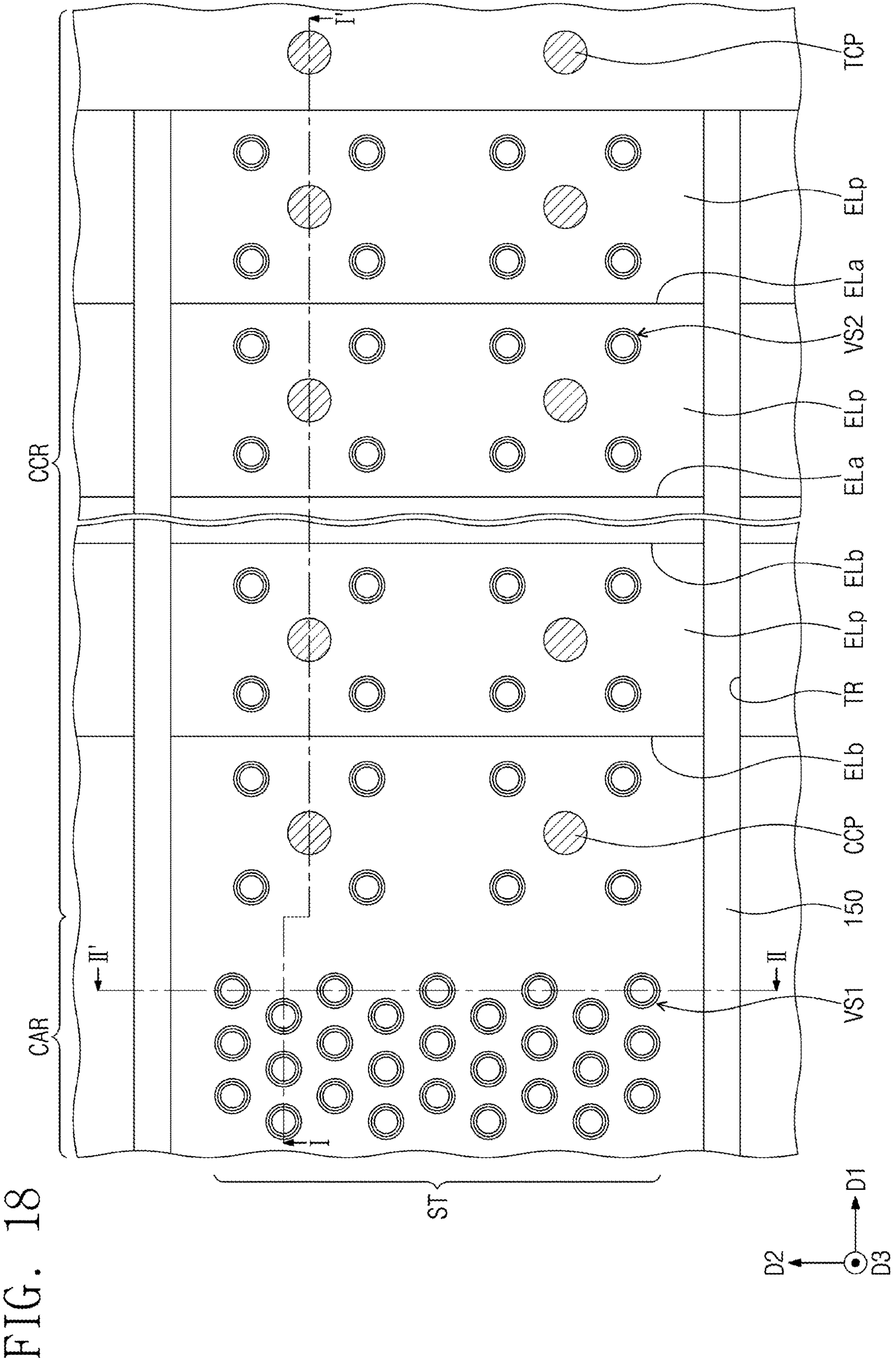
FIG. 18 is a plan view illustrating a three-dimensional semiconductor memory device according to an embodiment.
Figure 19A:
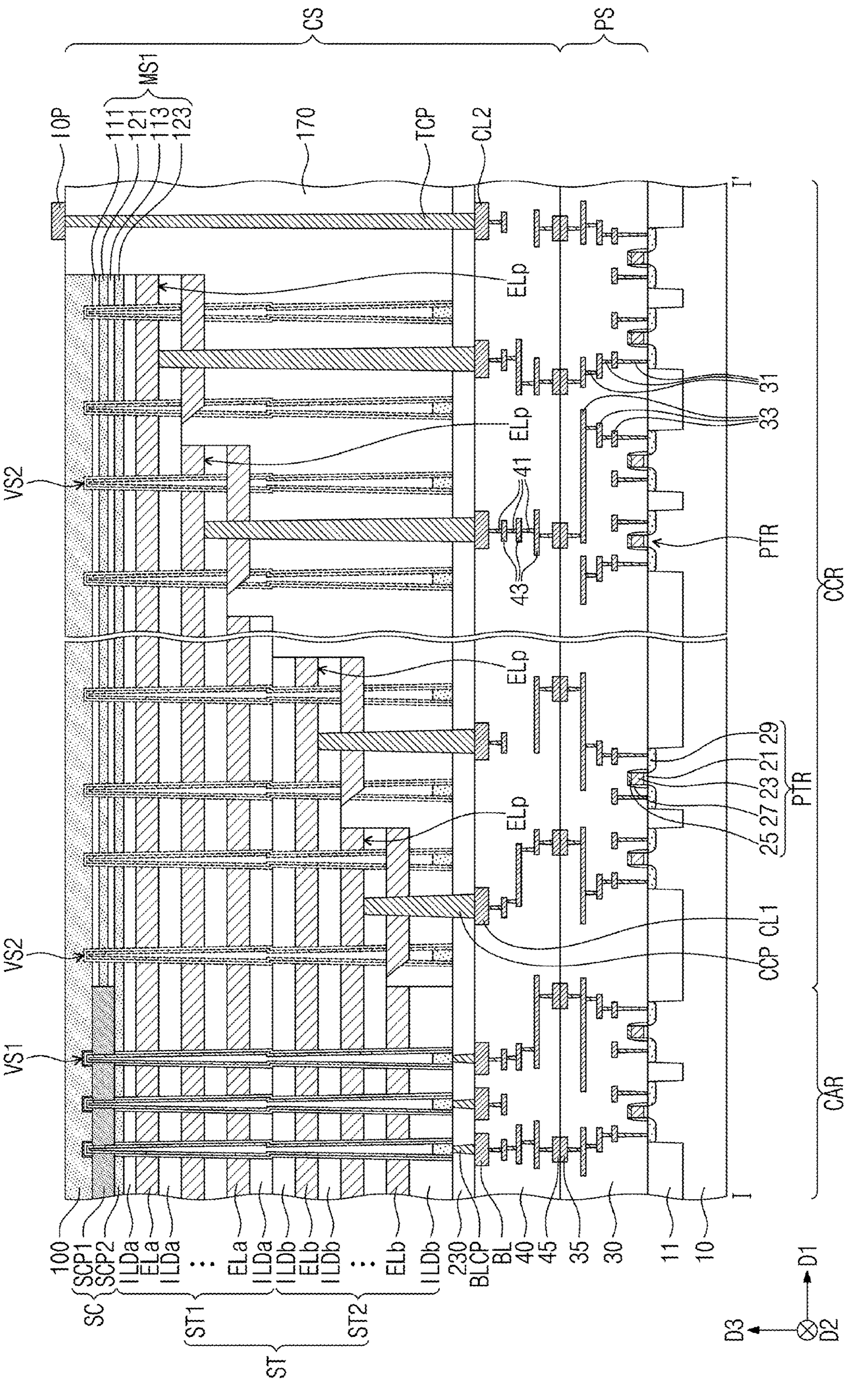
FIGS. 19A and 19B are sectional views, which are respectively taken along lines I-I' and II-II' of FIG. 18 to illustrate a three-dimensional semiconductor memory device according to an embodiment.
Figure 19B:
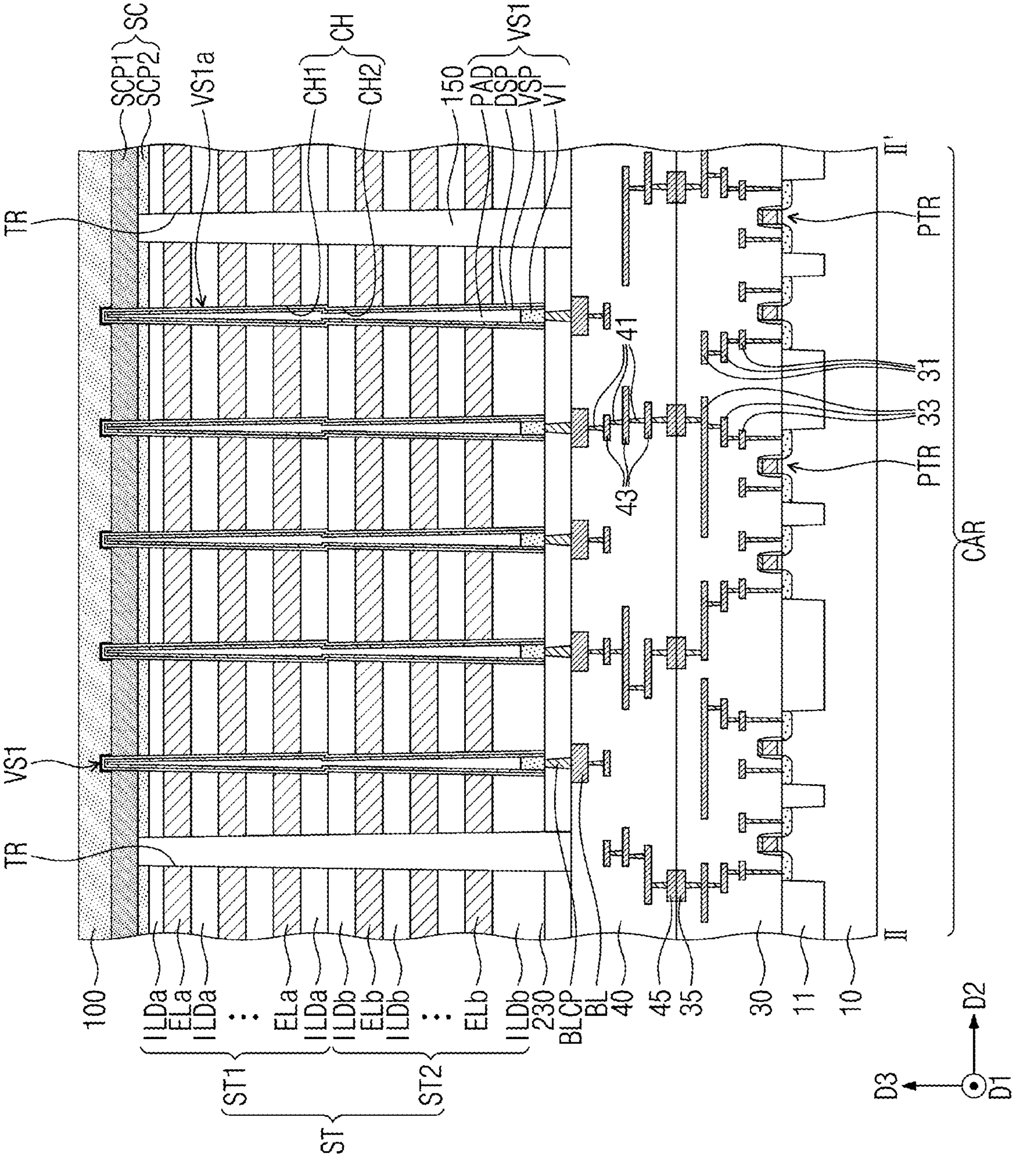

FIG. 18 is a plan view illustrating a three-dimensional semiconductor memory device according to an embodiment. FIGS. 19A and 19B are sectional views, which are respectively taken along lines I-I' and II-II' of FIG. 18 to illustrate a three-dimensional semiconductor memory device according to an embodiment. For concise description in the following, an element previously described with reference to FIGS. 5, 6A, and 6B may be identified by the same reference number without repeating an overlapping description thereof.

Referring to FIGS. 18, 19A, and 19B, the peripheral circuit structure PS may be provided on the first substrate 10. In an embodiment, the peripheral circuit structure PS may include the peripheral circuit transistors PTR, the peripheral contact plugs 31, the peripheral circuit interconnection lines 33 electrically connected to the peripheral circuit transistors PTR through the peripheral contact plugs 31, first bonding pads 35 electrically connected to the peripheral circuit interconnection lines 33, and the first insulating layer 30 enclosing the peripheral circuit transistors PTR, the peripheral contact plugs 31, the peripheral circuit interconnection lines 33, and the first bonding pads 35. The first insulating layer 30 may not cover top surfaces of the first bonding pads 35. The first insulating layer 30 may have a top surface that is substantially coplanar with the top surfaces of the first bonding pads 35.

The cell array structure CS including second bonding pads 45, the stack ST, and the second substrate 100 may be provided on the peripheral circuit structure PS. The second substrate 100 may be provided on the stack ST. The stack ST may be provided between the second substrate 100 and the peripheral circuit structure PS.

Second bonding pads 45, connection contact plugs 41, connection circuit interconnection lines 43, and a fourth insulating layer 40 may be provided on the first insulating layer 30. The second bonding pads 45 may be provided to be in contact with the first bonding pads 35 of the peripheral circuit structure PS. The connection circuit interconnection lines 43 may be electrically connected to the second bonding pads 45 through the connection contact plugs 41. The fourth insulating layer 40 may be provided to enclose the second bonding pads 45, the connection contact plugs 41, and the connection circuit interconnection lines 43. The fourth insulating layer 40 may have a multi-layered structure including a plurality of insulating layers. For example, the fourth insulating layer 40 may be formed of or include at least one of silicon oxide, silicon nitride, silicon oxynitride, and/or low-k dielectric materials. A width of each of the connection contact plugs 41 in the first or second direction D1 or D2 may decrease with increasing distance in the third direction D3 (i.e., with increasing distance from the first substrate 10). The connection contact plugs 41 and the connection circuit interconnection lines 43 may be formed of or include at least one of conductive materials (e.g., metallic materials).

The fourth insulating layer 40 may not cover bottom surfaces of the second bonding pads 45. The fourth insulating layer 40 may have a bottom surface that is substantially coplanar with the bottom surfaces of the second bonding pads 45. The bottom surface of each of the second bonding pads 45 may be in direct contact with the top surface of a corresponding one of the first bonding pads 35. The first and second bonding pads 35 and 45 may be formed of or include at least one of metallic materials (e.g., copper (Cu), tungsten (W), aluminum (Al), nickel (Ni), or tin (Sn)). For example, the first and second bonding pads 35 and 45 may be formed of or include copper (Cu). The first and second bonding pads 35 and 45 may be connected to each other without any interface therebetween to form a single object. The side surfaces of the first and second bonding pads 35 and 45 are illustrated to be aligned to each other, but embodiments are not limited to this example. For example, the side surfaces of the first and second bonding pads 35 and 45 may be spaced apart from each other, when viewed in a plan view.

The bit lines BL and the first and second conductive lines CL1 and CL2, which are in contact with the connection contact plugs 41, may be provided in an upper portion of the fourth insulating layer 40. The third insulating layer 230 may be provided on the fourth insulating layer 40, and the stack ST and the second insulating layer 170 may be provided on the third insulating layer 230.

Lengths of the first gate electrodes ELa of the first stack ST1 and the second gate electrodes ELb of the second stack ST2 in the first direction D1 may increase with increasing distance from the first substrate 10. The side surfaces of the first and second gate electrodes ELa and ELb may be spaced apart from each other by a specific distance in the first direction D1, when viewed in the plan view of FIG. 18. The lowermost one of the second gate electrodes ELb of the second stack ST2 may have the shortest length in the first direction D1, and the uppermost one of the first gate electrodes ELa of the first stack ST1 may have the longest length in the first direction D1. A length of each of the first and second interlayer insulating layers ILDa and ILDb in the first direction D1 may increase with increasing distance from the first substrate 10, similar to the first and second gate electrodes ELa and ELb.

The dummy pads DPAD may be disposed below the pad portions ELp. Each of the dummy pads DPAD may have opposite side surfaces and a bottom surface that are in contact with the second insulating layer 170.

Regarding the bit line contact plugs BLCP, the cell contact plugs CCP, the peripheral contact plug TCP, and the first and second vertical channel structures VS1 and VS2, the width in the first or second direction D1 or D2 may decrease according to increasing distance in the third direction D3. A width of the separation structure 150 in the second direction D2 may decrease according to increasing distance in the third direction D3.

An input/output pad TOP may be provided on the second insulating layer 170. In an embodiment, the input/output pad TOP may be electrically connected to at least one of the peripheral circuit transistors PTR of the peripheral circuit structure PS through the peripheral contact plug TCP. The input/output pad TOP may correspond to the input/output pad 1101 of FIG. 1 or one of the input/output pads 2210 of FIGS. 3 and 4.

Since the cell array structure CS is coupled to the peripheral circuit structure PS, the three-dimensional semiconductor memory device may have an increased cell capacity per unit area. In addition, the peripheral circuit structure PS and the cell array structure CS may be separately fabricated and then may be coupled to each other, and in this case, it may be possible to prevent the peripheral circuit transistors PTR from being damaged by thermal treatment processes. Accordingly, the electrical and reliability characteristics of the three-dimensional semiconductor memory device may be improved.

By way of summation and review, in the three-dimensional semiconductor memory device according to embodiments, the pad portion of the gate electrode and the dummy pad may be spaced apart from each other by one of the interlayer insulating layers. The dummy pad may be spaced apart from the gate electrode, which is adjacent thereto in a first direction. Meanwhile, the interlayer insulating layer may extend continuously from a region that vertically overlaps with the gate electrode adjacent to the dummy pad in the first direction, to a region that vertically overlaps with the dummy pad. Thus, the interlayer insulating layers may be used as a barrier that prevents the pad portions from being damaged in a wet etching process that is performed to form the dummy pads. Accordingly, it may be possible to improve the electrical and reliability characteristics of the three-dimensional semiconductor memory device.

Further, embodiments provide an electronic system that includes the three-dimensional semiconductor memory device. The three-dimensional semiconductor memory device provides improved electrical and reliability characteristics and provides a method of reducing process difficulty and cost in fabricating a three-dimensional semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:
- a first substrate including a cell array region and a contact region that extends from the cell array region;
- a stack including interlayer insulating layers and gate electrodes, which are alternatingly stacked on the first substrate, each of the gate electrodes having a pad portion on the contact region;
- an insulating layer that encloses the stack;
- a dummy pad on the pad portion;
- a source structure between the cell array region of the first substrate and the stack; and
- first vertical channel structures on the cell array region that fill vertical channel holes penetrating the stack and the source structure,
- wherein:
- the gate electrodes include a first gate electrode having a first pad portion that vertically overlaps the dummy pad, and a second gate electrode having a second pad portion that overlaps the dummy pad in a first direction parallel to a top surface of the first substrate,
- the first pad portion and the second pad portion are spaced apart from the dummy pad,
- one of the interlayer insulating layers is interposed between the first pad portion and the dummy pad,
- the one of the interlayer insulating layers interposed between the first pad portion and the dummy pad includes a connection portion that vertically overlaps a space between the dummy pad and the second pad portion, a first portion which vertically overlaps the second pad portion, and a second portion that vertically overlaps the dummy pad,
- the connection portion is interposed between the first portion and the second portion, and
- the one of the interlayer insulating layers continuously extends from the first portion through the connection portion to the second portion.

2. The semiconductor memory device as claimed in claim 1, wherein the insulating layer covers a top surface of the dummy pad.

3. The semiconductor memory device as claimed in claim 2, wherein the dummy pad includes a first side surface that is adjacent to the second pad portion, and a second side surface that is opposite to the first side surface, and
- the insulating layer also covers the first side surface and the second side surface.

4. The semiconductor memory device as claimed in claim 3, wherein the second side surface is aligned with a side surface of the one of the interlayer insulating layers and a side surface of the first pad portion.

5. The semiconductor memory device as claimed in claim 1, wherein the dummy pad exposes the connection portion of the one of the interlayer insulating layers to an outside.

6. The semiconductor memory device as claimed in claim 1, wherein the connection portion of the one of the interlayer insulating layers contacts the insulating layer.

7. The semiconductor memory device as claimed in claim 1, wherein the dummy pad includes the same material as the gate electrodes.

8. The semiconductor memory device as claimed in claim 1, wherein a thickness of the dummy pad is larger than a thickness of the second pad portion.

9. The semiconductor memory device as claimed in claim 1, wherein the source structure includes a first source conductive pattern and a second source conductive pattern, which are sequentially stacked on the first substrate,
- the first source conductive pattern is locally provided on the cell array region,
- the second source conductive pattern extends from the cell array region to the contact region in the first direction, and
- the first vertical channel structures include a vertical semiconductor pattern contacting the first source conductive pattern.

10. The semiconductor memory device as claimed in claim 9, further comprising:
- a second substrate interposed between the first substrate and the source structure,
- second vertical channel structures on the contact region, the second vertical channel structures penetrating the insulating layer and the stack, and
- wherein the first and second vertical channel structures also penetrate a portion of the second substrate.

11. The semiconductor memory device as claimed in claim 10, wherein the second vertical channel structures penetrate the dummy pad.

12. The semiconductor memory device as claimed in claim 1, further comprising cell contact plugs that penetrate the insulating layer and the dummy pad,
- wherein the cell contact plugs also penetrate the interlayer insulating layers and contact the first pad portion.

13. An electronic system, comprising:
- a three-dimensional semiconductor memory device including a first substrate including a cell array region and a contact region that extends from the cell array region, a peripheral circuit structure on the first substrate, a cell array structure on the peripheral circuit structure, an insulating layer covering the cell array structure, and an input/output pad on the insulating layer, the input/output pad being electrically connected to the peripheral circuit structure; and
- a controller that is electrically connected to the three-dimensional semiconductor memory device through the input/output pad and is configured to control the three-dimensional semiconductor memory device,
- wherein:
- the cell array structure includes:
- a second substrate on the peripheral circuit structure;
- a stack including interlayer insulating layers and gate electrodes, which are alternatingly stacked on the second substrate, each of the gate electrodes including a pad portion on the contact region;
- a dummy pad on the pad portion; and
- vertical channel structures on the cell array region, the vertical channel structures filling vertical channel holes penetrating the stack; and a cell contact plug penetrating the insulating layer and the dummy pad, wherein the gate electrodes include a first gate electrode that is vertically spaced apart from the dummy pad, and a second gate electrode that is spaced apart from the dummy pad in a first direction parallel to a top surface of the first substrate, one of the interlayer insulating layers is interposed between the dummy pad and the first gate electrode, a bottom surface of the dummy pad is in contact with the one of the interlayer insulating layers, and the dummy pad is electrically connected to the controller through the cell contact plug.

14. The electronic system as claimed in claim 13, wherein:

the one of the interlayer insulating layers includes a connection portion that vertically overlaps a space between the dummy pad and the second gate electrode, and the one of the interlayer insulating layers extends in the first direction without a cut portion on the connection portion.

* * * * *